United States Patent
Saitoh et al.

(10) Patent No.: US 12,342,714 B2
(45) Date of Patent: Jun. 24, 2025

(54) DISPLAY DEVICE INCLUDING AN INORGANIC-INSULATING-FILM-FREE REGION PROVIDED ALONG A NOTCH TO STRENGTHEN THE STRUCTURE OF THE DISPLAY DEVICE

(71) Applicant: SHARP KABUSHIKI KAISHA, Sakai (JP)

(72) Inventors: Takao Saitoh, Sakai (JP); Yohsuke Kanzaki, Sakai (JP); Masaki Yamanaka, Sakai (JP); Yi Sun, Sakai (JP); Masahiko Miwa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 518 days.

(21) Appl. No.: 17/790,101

(22) PCT Filed: Jan. 20, 2020

(86) PCT No.: PCT/JP2020/001707
§ 371 (c)(1),
(2) Date: Jun. 29, 2022

(87) PCT Pub. No.: WO2021/149108
PCT Pub. Date: Jul. 29, 2021

(65) Prior Publication Data
US 2023/0041278 A1 Feb. 9, 2023

(51) Int. Cl.
*H10K 77/10* (2023.01)
*H10K 50/844* (2023.01)
*H10K 59/131* (2023.01)

(52) U.S. Cl.
CPC ........ *H10K 77/111* (2023.02); *H10K 50/844* (2023.02); *H10K 59/131* (2023.02)

(58) Field of Classification Search
CPC .. H10K 77/111; H10K 50/844; H10K 59/131; G09F 9/30
USPC .......................................................... 257/40
See application file for complete search history.

(56) References Cited

U.S. PATENT DOCUMENTS

| | | | |
|---|---|---|---|
| 2002/0187575 A1* | 12/2002 | Maruyama | H10K 59/8722 438/33 |
| 2019/0197976 A1 | 6/2019 | Sasaki | |
| 2020/0235193 A1 | 7/2020 | Tokuda | |
| 2022/0013546 A1 | 1/2022 | Tokuda | |

FOREIGN PATENT DOCUMENTS

| | | |
|---|---|---|
| JP | 2019-109371 A | 7/2019 |
| WO | 2019/077841 A1 | 4/2019 |
| WO | 2019/167113 A1 | 9/2019 |

* cited by examiner

*Primary Examiner* — Quoc D Hoang
(74) *Attorney, Agent, or Firm* — ScienBiziP, P.C.

(57) ABSTRACT

A resin substrate layer and a first inorganic insulating film on the resin substrate layer are provided. A notch is provided to an end portion of the resin substrate layer. A first inorganic-insulating-film-free region is provided along the notch. From the first inorganic-insulating-film-free region, the first inorganic insulating film is removed.

18 Claims, 13 Drawing Sheets

DISPLAY DEVICE INCLUDING AN INORGANIC-INSULATING-FILM-FREE REGION PROVIDED ALONG A NOTCH TO STRENGTHEN THE STRUCTURE OF THE DISPLAY DEVICE

TECHNICAL FIELD

The disclosure relates to a display device.

BACKGROUND ART

In recent years, light-emitting organic electroluminescence (EL) display devices using organic EL elements are drawing attention as a replacement for liquid crystal display devices. A proposed one of such organic EL display devices is a flexible organic EL device provided with a display panel including: a flexible resin substrate; and such components as organic EL elements formed on the resin substrate. Here, a structure proposed for the organic EL display device includes a cut-out region (hereinafter also referred to as a "notch") provided to an end portion of the display panel in order to mount such electronic components as a camera and a fingerprint sensor.

For example, Patent Document 1 discloses a display device including a display unit having a notch such that scan signal lines are not uniform in length. Of the scan signal lines, predetermined scan signal lines are each electrically separated by the notch into two signal lines. Hence, the display unit displays an evenly-presented excellent image.

CITATION LIST

Patent Literature

[Patent Document] Japanese Unexamined Patent Application Publication No. 2019-109371

SUMMARY

Technical Problems

The flexible organic EL display device is provided with an inorganic insulating film including: a resin substrate; and a thin-film-transistor (hereinafter also referred to as "TFT") layer formed on the resin substrate. This inorganic insulating film is vulnerable to bending and susceptible to cracks. Hence, if the display panel is designed to have a notch provided relatively deeply toward the display region to display an image, the inorganic insulating film around the notch might have a crack when the display panel is bent horizontally. Moreover, if the crack in the inorganic insulating film becomes wider, the crack might propagate to another film.

In view of the above problems, the disclosure is intended to reduce the risk of a crack opening and propagating in an inorganic insulating film around a notch of an organic EL display device.

Solution to Problems

In order to achieve the above object, a display device according to the disclosure includes: a flexible substrate, and a first inorganic insulating film including at least one layer and provided on the flexible substrate; a notch provided to an end portion of the flexible substrate; and a first inorganic-insulating-film-free region from which the first inorganic insulating film is removed, the first inorganic-insulating-film-free region being provided along the notch.

Advantageous Effects of Disclosure

In the disclosure, the first inorganic-insulating-film-free region is provided on the flexible substrate along the notch provided at an end portion of the flexible substrate. From the inorganic-insulating-film-free region, the first inorganic insulating film is removed. Such features can reduce the risk of a crack opening and propagating around the notch.

BRIEF DESCRIPTION OF DRAWINGS

FIG. 7 corresponds to FIG. 1.

FIG. 8 corresponds to FIG. 1.

FIG. 9 corresponds to FIG. 6.

FIG. 10 corresponds to FIG. 1.

FIG. 11 corresponds to FIG. 1.

FIG. 12 corresponds to FIG. 1.

FIG. 13 corresponds to FIG. 6.

FIG. 14 corresponds to FIG. 1.

DESCRIPTION OF EMBODIMENTS

Described below in derail are embodiments of the disclosure, with reference to the drawings. Note that the disclosure shall not be limited to the embodiments below.

First Embodiment

Figure 1:
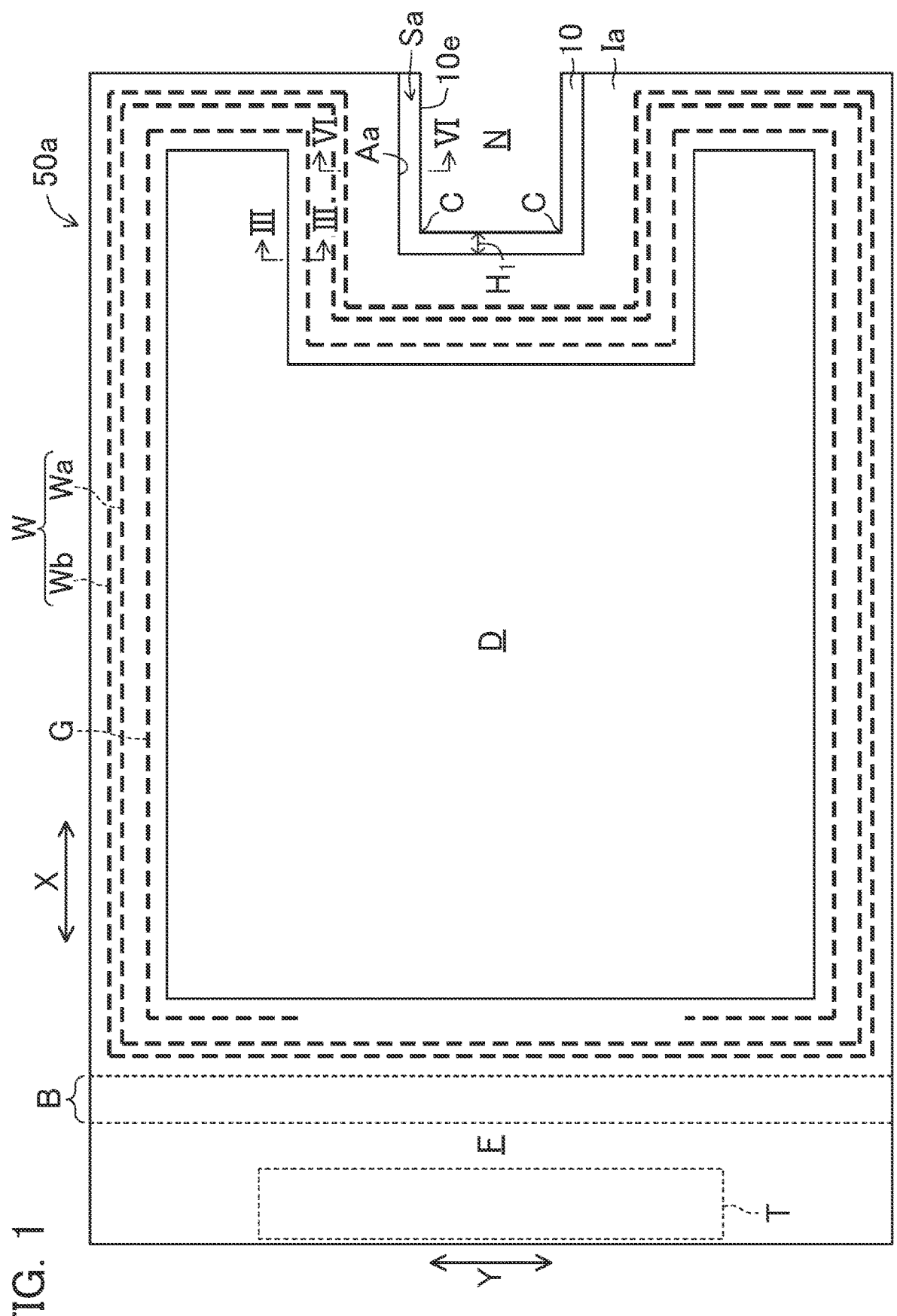
FIG. 1 is a plan view of a schematic configuration of an organic EL display device according to a first embodiment of the disclosure.
Figure 2:
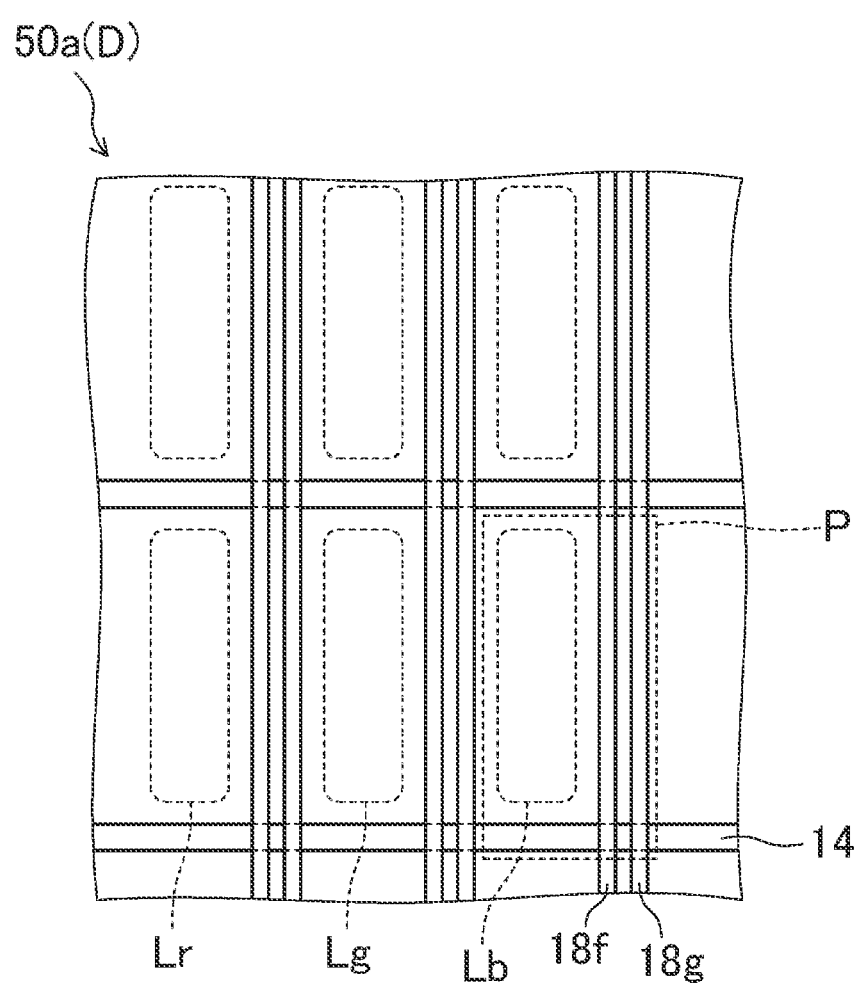
FIG. 2 is a plan view of a display region of the organic EL display device according to the first embodiment of the disclosure.
Figure 3:
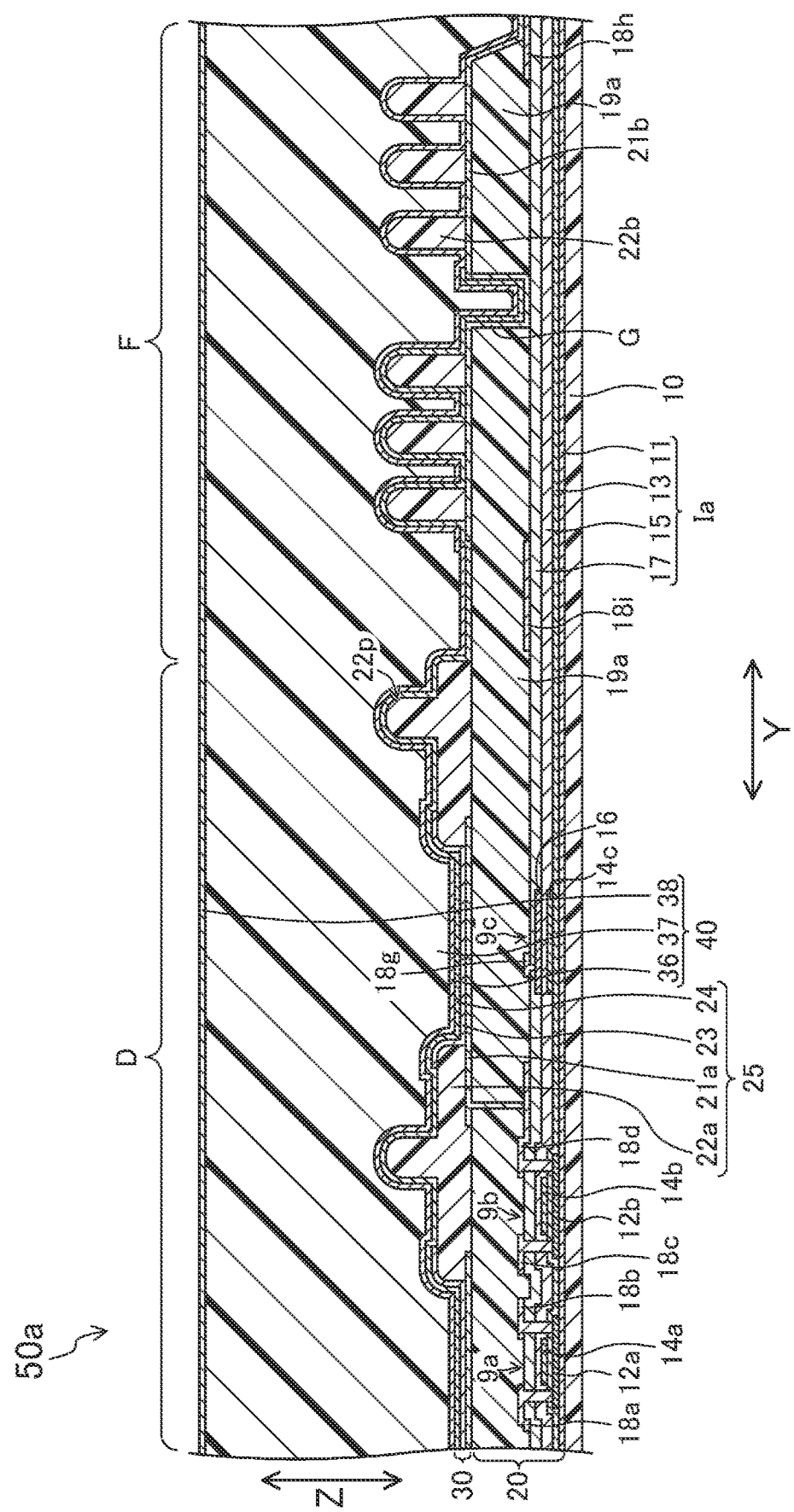
FIG. 3 is a cross-sectional view of the organic EL display device, taken from line in FIG. 1.
Figure 4:
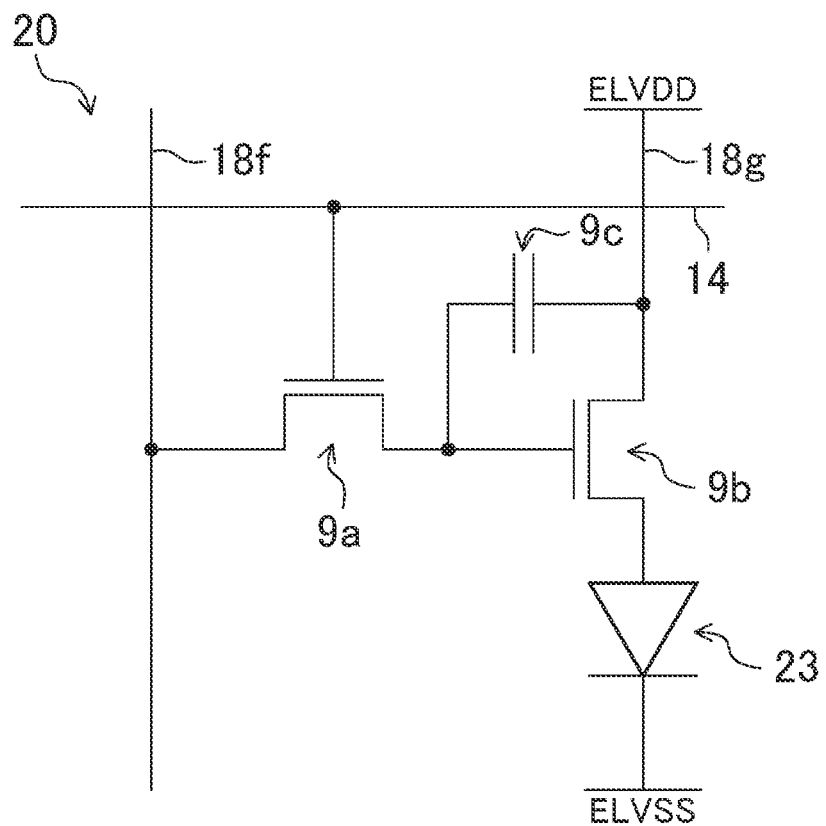
FIG. 4 is an equivalent circuit diagram illustrating a thin-film-transistor (TFT) layer included in the organic EL display device according to a first embodiment of the disclosure.
Figure 5:
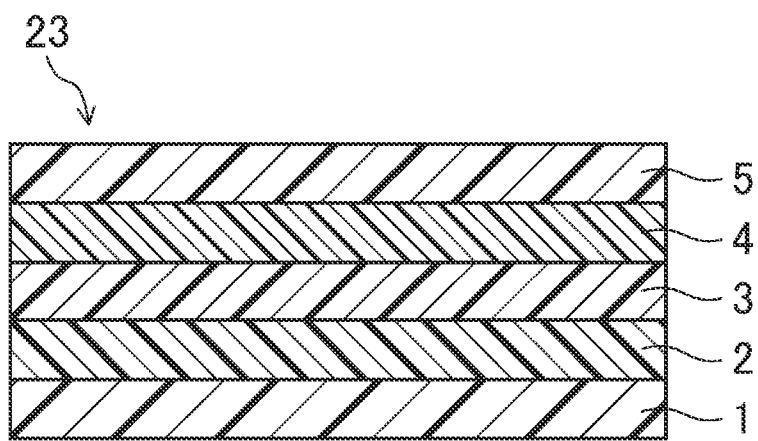
FIG. 5 is a cross-sectional view of an organic EL layer included in the organic EL display device according to the first embodiment of the disclosure.
Figure 6:
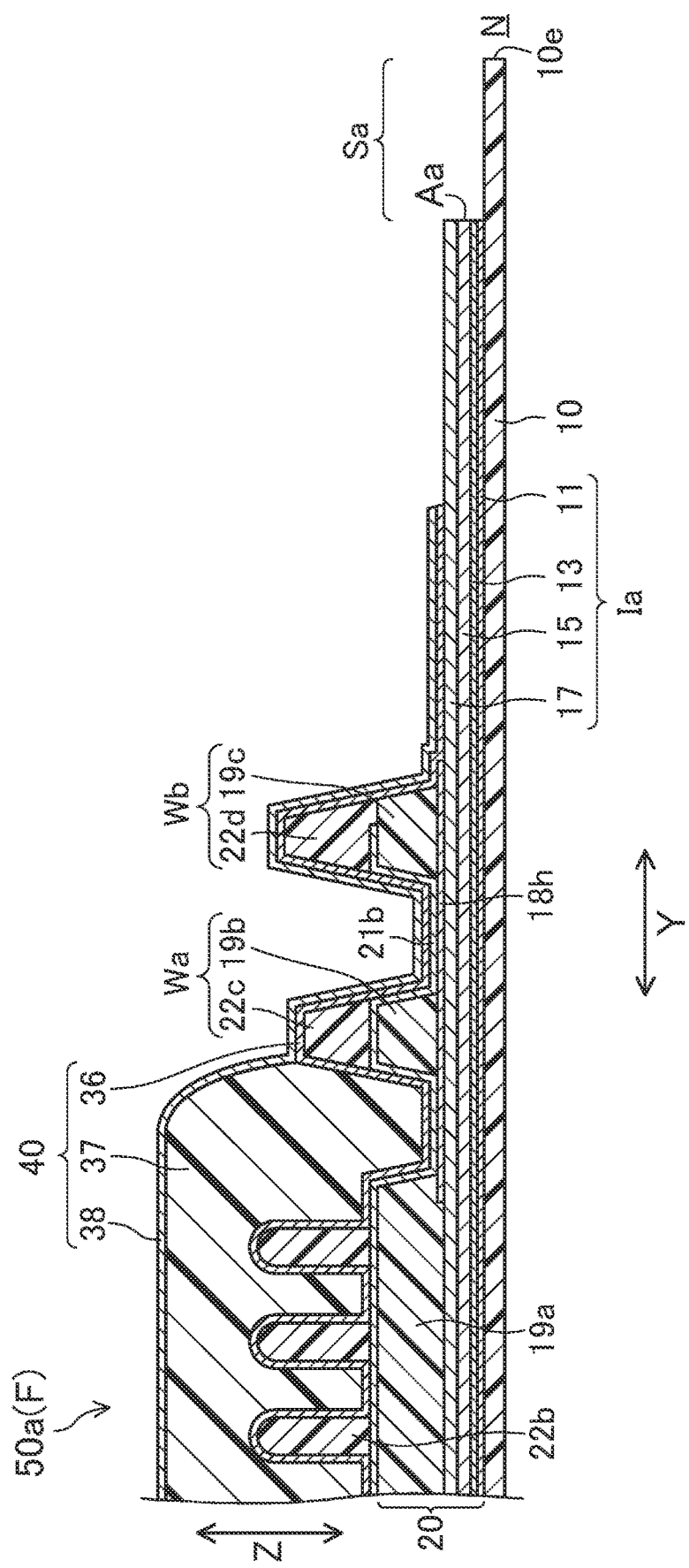
FIG. 6 is a cross-sectional view of the organic EL display device according to the first embodiment of the disclosure, taken from line VI-VI in FIG. 1.

FIGS. 1 to 7 illustrate a first embodiment of a display device according to the disclosure. The embodiments below exemplify an organic EL display device including an organic EL element, as a display device including a light-emitting element. FIG. 1 is a plan view illustrating a schematic configuration of an organic EL display device 50a according to this embodiment. FIG. 2 is a plan view of a display region D of the organic EL display device 50a. FIG. 3 is a cross-sectional view of the display region D of the organic EL display device 50a. FIG. 4 is an equivalent circuit diagram illustrating a TFT layer 20 included in the organic EL display device 50a. FIG. 5 is a cross-sectional view of an organic EL layer 23 included in the organic EL display device 50a. FIG. 6 is a cross-sectional view of the organic EL display device 50a, taken from line VI-VI in FIG. 1. Note that, as to the organic EL display device 50a, directions X, Y, and Z are defined. The direction X (see FIG. 1) is in parallel with a substrate surface of a resin substrate layer 10 to be described later. The direction Y (see FIGS. 3 and 6) is perpendicular to the direction X and in parallel with the substrate surface of the resin substrate layer 10. The direction Z (see FIGS. 3 and 6) is perpendicular to the directions X and Y.

As illustrated in FIG. 1, the organic EL display device 50a includes a notch N in an intermediate portion on an end portion (i.e. an end portion on the right in FIG. 1) of a display panel. The notch N is a region cut out in a rectangular shape. In the organic EL display device 50a, this notch N is formed relatively deeply toward the display region D to be described later. The size of the notch N may be determined, depending on the size of the display panel. For example, the notch N has a depth (a length in the direction X) of approximately 5 to 10 mm, and a width (a length in the direction Y) of approximately 10 to 20 mm. Note that, in this embodiment, the notch N is, for example, rectangular. Examples of the rectangle include such substantial rectangles as a rectangle having arc-like sides and a rectangle having rounded corners. Moreover, the shapes of the notch N shall not be limited to be a rectangle and a substantial rectangle. The shapes may be such polygons as a triangle, a pentagon, and a hexagon.

As illustrated in FIG. 1, the organic EL display device 50a includes: the display region D to display an image; and a frame region F shaped into a rectangular frame and provided around the display region D. The display region D is shaped into a substantial rectangle whose one side (the right side in FIG. 1) has an intermediate portion including a C-shaped cut-out that bends inwards in plan view to correspond to the position of the notch N. Note that this embodiment shows, as an example, the display region D shaped into a substantial rectangle. Examples of the substantial rectangle include such substantial rectangles having arc-like sides and rounded corners. The examples also include a rectangle.

As illustrated in FIG. 2, the display region D includes a plurality of sub-pixels P arranged in a matrix. The display region D illustrated in FIG. 2 includes, for example: the sub-pixels P having red light-emitting regions Lr for presenting red; the sub-pixels P having green light-emitting regions Lg for presenting green; and the sub-pixels P having blue light-emitting regions Lb for presenting blue. These sub-pixels P are provided next to one another. Note that, in the display region D, for example, neighboring three of the sub-pixels P each having one of a red light-emitting region Lr, a green light-emitting region Lg, and a blue light-emitting region Lb constitute one pixel.

In FIG. 1, the frame region F has a left end portion (an end portion across from the notch N) provided with a terminal unit T extending in a single direction (a vertical direction of the drawing). As illustrated in FIG. 1, the frame region F includes a folding portion B between the display region D and the terminal unit T. The folding portion B, extending in a single direction (the vertical direction of the drawing), is foldable at an angle of, for example, 180° (foldable in a U-shape) around a folding axis in the vertical direction of the drawing. Here, in the frame region F, a planarization film 19a to be described later is provided with a trench G penetrating the planarization film 19a as illustrated in FIGS. 1 and 3. Note that, as illustrated in FIG. 1, the trench G is laid into a substantial C-shape to open toward the terminal unit T in planar view.

As illustrated in FIGS. 3 and 6, the organic EL display device 50a includes: the resin substrate layer 10 provided as a flexible substrate; the TFT layer 20 provided on the resin substrate layer 10; an organic EL element layer 30 provided on the TFT layer 20 and serving as a light-emitting-element layer included in the display region D; and a sealing layer 40 provided on the organic EL element layer 30.

The resin substrate layer 10 is made of, for example, polyimide.

As illustrated in FIGS. 3 and 6, the TFT layer 20 includes: a first inorganic insulating film including at least one layer (hereinafter simply referred to as a "first inorganic insulating film Ia") and provided on the resin substrate layer 10; and the planarization film 19a. The first inorganic insulating film Ia includes: a base coat film 11; a gate insulating film 13; a first interlayer insulating film 15; a second interlayer insulating film 17. The planarization film 19a is provided on the second interlayer insulating film 17. Specifically, as illustrated in FIG. 3, the TFT layer 20 includes: the base coat film 11 provided on the resin substrate layer 10; a first TFT 9a, a second TFT 9b, and a capacitor 9c provided on the base coat film 11 and serving as a pixel circuit (see FIG. 4) for each sub-pixel P; and the planarization film 19a provided for the TFTs on the first TFTs 9a, the second TFTs 9b, and the capacitors 9c. Here, the TFT layer 20 includes a plurality of the pixel circuits arranged in a matrix to correspond to a plurality of the pixel sub-pixels P. Moreover, as illustrated in FIGS. 2 and 4, the TFT layer 20 includes a plurality of gate lines 14 horizontally extending in parallel with one another in the drawings. Furthermore, as illustrated in FIGS. 2 and 4, the TFT layer 20 includes a plurality of source lines 18f vertically extending in parallel with one another in the drawings. In addition, as illustrated in FIGS. 2 and 4, the TFT layer 20 includes a plurality of power source lines 18g vertically extending in parallel with one another in the drawings. Note that, as illustrated in FIG. 3, the power source lines 18g and the source lines 18f are provided next to each other.

Each of the base coat film 11, the gate insulating film 13, the first interlayer insulating film 15, and the second interlayer insulating film 17 included in the first inorganic insulating film Ia is, for example, a monolayer inorganic insulating film made of such materials as silicon nitride, silicon oxide, and silicon oxide nitride. Alternatively, each of these films is a multilayer inorganic insulating film made of these materials.

As illustrated in FIG. 4, in each sub-pixel P, the first TFT 9a is electrically connected to the corresponding gate line 14 and source line 18f. The first TFT 9a illustrated in FIG. 3 includes: a semiconductor layer 12a; a gate insulating film 13; a gate electrode 14a; the first interlayer insulating film 15; the second interlayer insulating film 17; and a source electrode 18a and a drain electrode 18b, all of which are provided above the base coat film 11 in the stated order. The semiconductor layer 12a illustrated in FIG. 3 is, for example, made of a low-temperature-polysilicon film and an In—Ga—Zn—O-based oxide semiconductor film, shaped into an island, and provided on the base coat film 11. The semiconductor layer 12a includes a channel region, a source region, and a drain region. The gate insulating film 13 illustrated in FIG. 3 is provided to cover the semiconductor layer 12a. The gate electrode 14a illustrated in FIG. 3 is provided on the gate insulating film 13 to overlap the channel region of the semiconductor layer 12a. The first interlayer insulating film 15 and the second interlayer insulating film 17 illustrated in FIG. 3 are provided in the stated order to cover the gate electrode 14a. The source electrode 18a and the drain electrode 18b illustrated in FIG. 3 are spaced apart from each other on the second interlayer insulating film 17. As illustrated in FIG. 3, the source electrode 18a and the drain electrode 18b are respectively and electrically connected to the source region and the drain region of the semiconductor layer 12a through contact holes each formed in a multilayer film including the gate insulating film 13, the first interlayer insulating film 15, and the second interlayer insulating film 17.

As illustrated in FIG. 4, in each sub-pixel P, the second TFT 9b is electrically connected to the corresponding first TFT 9a and power source line 18g. The second TFT 9b illustrated in FIG. 3 includes: a semiconductor layer 12b; the gate insulating film 13; a gate electrode 14b; the first interlayer insulating film 15; the second interlayer insulating film 17; and a source electrode 18c and a drain electrode 18d, all of which are provided above the base coat film 11 in the stated order. The semiconductor layer 12b illustrated in FIG. 3 is, for example, made of a low-temperature-polysilicon film and an In—Ga—Zn—O-based oxide semiconductor film, shaped into an island, and provided on the base coat film 11. The semiconductor layer 12b includes a channel region, a source region, and a drain region. The gate insulating film 13 illustrated in FIG. 3 is provided to cover the semiconductor layer 12b. The gate electrode 14b illustrated in FIG. 3 is provided on the gate insulating film 13 to overlap the channel region of the semiconductor layer 12b. The first interlayer insulating film 15 and the second interlayer insulating film 17 illustrated in FIG. 3 are provided in the stated order to cover the gate electrode 14b. The source electrode 18c and the drain electrode 18d illustrated in FIG. 3 are spaced apart from each other on the second interlayer insulating film 17. As illustrated in FIG. 3, the source electrode 18c and the drain electrode 18d are respectively and electrically connected to the source region and the drain region of the semiconductor layer 12b through contact holes each formed in a multilayer film including the gate insulating film 13, the first interlayer insulating film 15, and the second interlayer insulating film 17.

Note that, as an example, the first TFTs 9a and the second TFTs 9b in this embodiment are top gate TFTs. Alternatively, the first TFTs 9a and the second TFTs 9b may be bottom gate TFTs.

As illustrated in FIG. 4, in each sub-pixel P, the capacitor 9c is electrically connected to the corresponding first TFT 9a and power source line 18g. The capacitor 9c illustrated in FIG. 3 includes: a lower conductive layer 14c formed of the same material, and in the same layer, as the gate electrodes 14a and 14b; the first interlayer insulating film 15 provided to cover the lower conductive layer 14c; and an upper conductive layer 16 provided on the first interlayer insulating film 15 to overlap the lower conductive layer 14c. Note that the upper conductive layer 16 illustrated in FIG. 3 is electrically connected to the power source line 18g through a contact hole formed in the second interlayer insulating film 17.

The planarization film 19a is made of such an organic resin material as, for example, polyimide-based resin and acrylic resin. The planarization film 19a has a flat surface in the display region D.

As illustrated in FIG. 3, in the display region D, the organic EL element layer 30 includes a plurality of organic EL elements 25 arranged in a matrix on the planarization film 19a to correspond to a plurality of the pixel circuits. More specifically, the organic EL element layer 30 includes the organic EL elements 25 arranged in a matrix. As illustrated in FIG. 3, the organic EL element layer 30 includes: a plurality of first electrodes 21a; a plurality of the organic EL layers 23 provided as functional layers; and a second electrode 24, all of which are provided above the TFT layer 20 in the stated order.

As illustrated in FIG. 3, each of the first electrodes 21a is connected to the drain electrode 18d (or the source electrode 18c) of a corresponding one of the second TFTs 9b through a contact hole formed in the planarization film 19a. The first electrodes 21a are light-reflective and capable of injecting holes into the organic EL layers 23. Preferably, each of the first electrodes 21a is formed of a material having a high work function in order to improve efficiency in injecting the holes into the organic EL layers 23. Exemplary materials of the first electrodes 21a include such metal materials as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Moreover, the exemplary materials of the first electrodes 21a may also include an alloy of astatine (At)/astatine dioxide ($AtO_2$). Furthermore, exemplary materials of the first electrodes 21a may include such conductive oxides as tin oxide (SnO), zinc oxide (ZnO), indium tin oxide (ITO), and indium zinc oxide (IZO). Each of the first electrodes 21a may be a multilayer including two or more layers made of the above materials. Exemplary compound materials having a large work function include indium tin oxide (ITO) and indium zinc oxide (IZO).

Moreover, peripheral end portions of the first electrodes 21a are covered with an edge cover 22a shaped into a grid and provided all across the display region D. Exemplary materials of the edge cover 22a include such positive photosensitive resins as polyimide-based resin, acrylic resin, polysiloxane-based resin, and novolak resin. The edge cover 22a illustrated in FIG. 3 has a surface partially provided with pixel photo spacers 22p. In FIG. 3, each of the pixel photo spacers 22p, serving as a first photo spacer, is shaped into an island, and protrudes upwards.

As illustrated in FIG. 5, each of the organic EL layers 23 includes: a hole-injection layer 1; a hole-transport layer 2; a light-emitting layer 3; an electron-transport layer 4; and an electron-injection layer 5, all of which are provided above the first electrode 21a in the stated order.

The hole injection layer 1, also referred to as an anode buffer layer, is capable of approximating the energy levels of the first electrode 21a and the organic EL layer 23 and increasing efficiency in injection of the holes from the first electrode 21a to the organic EL layer 23. Exemplary materials of the hole injection layer 1 may include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole-transport layer 2 is capable of improving efficiency in transporting the holes from the first electrode 21a to the organic EL layer 23. Exemplary materials of the hole transport-layer 2 may include porphyrin derivatives, aromatic tertiary amine compounds, styryl amine derivatives, polyvinylcarbazole, poly-p-phenylene vinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region into which the holes and the electrons are injected respectively from the first electrodes 21a and the second electrode 24 and recombine together, when a voltage is applied by the first electrodes 21a and the second electrode 24. This light-emitting layer 3 is formed of a material with high light emission efficiency. Exemplary materials of the light-emitting layer 3 may include metal oxinoid compounds [8-hydroxyquinoline metal complexes], naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rodamine derivatives, acridine derivatives, phenoxazone, quinacridone derivatives, rubrene, poly-p-phenylene vinylene, and polysilane.

The electron-transport layer 4 is capable of efficiently transporting the electrons to the light-emitting layer 3. Exemplary materials of the electron-transport layer 4 may include, as organic compounds, oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds.

The electron-injection layer 5 is capable of approximating the energy levels of the second electrode 24 and the organic EL layer 23, and increasing efficiency in injection of the electrons from the second electrode 24 to the organic EL layer 23. Such a feature makes it possible to decrease a drive voltage of the organic EL element 25. The electron-injection layer 5 may also be referred to as a cathode buffer layer. Exemplary materials of the electron-injection layer 5 may include: such inorganic alkaline compounds as lithium fluoride (LiF), magnesium fluoride ($MgF_2$), calcium fluoride ($CaF_2$), strontium fluoride ($SrF_2$), and barium fluoride ($BaF_2$); aluminum oxide ($Al_2O_3$); and strontium oxide (SrO).

As illustrated in FIG. 3, the second electrode 24 is provided to cover the organic EL layers 23 of the sub-pixels P and the edge cover 22a in common among all the sub-pixels P. The second electrode 24 is capable of injecting electrons into the organic EL layers 23. Preferably, the second electrode 24 is made of a material having a low work function in order to improve efficiency in injection of the electrons into the organic EL layers 23. Exemplary materials of the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 24 may also be formed of an alloy of magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), and lithium fluoride (LiF)/calcium (Ca)/aluminum (Al). The second electrode 24 may also be formed of such conductive oxides as tin oxide (SnO), zinc oxide (ZnO), indium tin oxide (ITO) and indium zinc oxide (IZO). The second electrode 24 may be a multilayer including two or more layers made of the above materials. Exemplary materials having a low work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and fluoride (LiF)/calcium (Ca)/aluminum (Al).

As illustrated in FIG. 3, the sealing layer 40 is provided on the organic EL element layer 30 to cover the organic EL elements 25. Specifically, the sealing layer 40 illustrated in FIG. 3 includes: a first inorganic sealing film 36 provided toward the resin substrate layer 10 in order to cover the second electrode 24; an organic sealing film 37 provided on the first inorganic sealing film 36; and a second inorganic sealing film 38 provided to cover the organic sealing film 37. This sealing layer 40 is capable of protecting the organic EL layers 23 from such objects as water and oxygen. The first inorganic sealing film 36 and the second inorganic sealing film 38 are made of such inorganic materials as silicon dioxide ($SiO_2$), aluminum oxide ($Al_2O_3$), silicon nitride ($SiN_x$ (where x is a positive integer)) such as trisilicon tetranitride ($Si_3N_4$), and silicon carbide nitride (SiCN). Exemplary materials of the organic sealing film 37 include such organic materials as acrylic resin, polyuria resin, parylene resin, polyimide-based resin, and polyamide-based resin.

Moreover, as illustrated in FIGS. 1 and 6, the organic EL display device 50a includes, in the frame region F: a first outer barrier wall Wa shaped into a frame and provided to surround the display region D and overlap an outer peripheral end portion of the organic insulating film 37; and a second outer barrier wall Wb shaped into a frame and provided to surround the first outer barrier wall Wa.

The first outer barrier wall Wa illustrated in FIG. 6 includes a first resin layer 19b formed of the same material, and in the same layer, as the planarization film 19a is; and a second resin layer 22c provided above the first resin layer 19b through a first conductive layer 21b, and formed of the same material, and in the same layer, as the edge cover 22a is. Here, as illustrated in FIG. 6, the first conductive layer 21b is provided in the frame region F and shaped into a substantial C-shape to coincide with the trench G, the first outer barrier wall Wa, and the second outer barrier wall Wb. Note that the second conductive layer 21b is formed of the same material, and in the same layer, as the first electrodes 21a is.

The second outer barrier wall Wb illustrated in FIG. 6 includes a first resin layer 19c formed of the same material, and in the same layer, as the planarization film 19a is; and a second resin layer 22d provided above the first resin layer 19c through the first conductive layer 21b, and formed of the same material, and in the same layer, as the edge cover 22a is.

Furthermore, as illustrated in FIGS. 3 and 6, the organic EL display device 50a includes, in the frame region F, a first frame wire 18h provided outside the trench G to surround the display region D and coincide with the first outer barrier wall Wa and the second outer barrier wall Wb. In the terminal unit T, the first frame wire 18h is electrically connected to a not-shown power supply terminal receiving a low power-supply voltage (ELVSS). Moreover, the first frame wire 18h is electrically connected to the second electrode 24 through the first conductive layer 21b. Note that the first frame wire 18h is laid continuously to the power supply terminal receiving a low power-supply voltage (see FIG. 12). Here, the term "continuously" means a case where a diode formed of a transistor is sandwiched between the terminal unit T and a wire (near the terminal unit T) in order to remove noise of an input signal. However, such a configuration will not fail to achieve the object of the disclosure, and will be included in the term "continuously" recited in the disclosure. In such a case, the first frame wire 18h is electrically connected to an anode of the diode. Moreover, the frame wire 18h is formed of the same material, and in the same layer, as the source lines 18f are.

Furthermore, as illustrated in FIG. 3, the organic EL display device 50a includes, in the frame region F, a second frame wire 18i laid behind the trench G. In the terminal unit T, the second frame wire 18i is electrically connected to a not-shown power supply terminal receiving a high power-supply voltage (ELVDD). Moreover, near the display area D, the second frame wire 18i is electrically connected to the power supply lines 18g arranged in the display area D. Note that the second frame wire 18i is laid continuously to the power supply terminal receiving the high power-supply voltage (see FIG. 12). As described above, if a diode is sandwiched between the terminal unit T and a wire, the second frame wire 18i is electrically connected to a cathode of the diode. Moreover, the second frame wire 18i is formed of the same material, and in the same layer, as the source lines 18f are.

As illustrated in FIGS. 3 and 6, the organic EL display device 50a includes, in the frame region F, a plurality of frame photo spacers 22b each shaped into an island, provided above the planarization film 19a, and protruding upward in the drawings. The frame photo spacers 22b serve as second photo spacers. Here, the frame photo spacers 22b are formed of the same material, and in the same layer, as the edge cover 22a is. Each of the frame photo spacers may be a multilayer including: a resin layer formed of the same material, and in the same layer, as the edge cover 22a is; and another layer.

Here, the organic EL display device 50a illustrated in FIGS. 1 and 6 includes a first inorganic-insulating-film-free region Sa provided along the notch N. This first inorganic-insulating-film-free region Sa illustrated in FIG. 1 is formed to continuously extend in the directions X and Y along a peripheral end portion of the notch N. That is, the first inorganic-insulating-film-free region Sa is formed all around the notch N. Moreover, the first inorganic-insulating-film-free region Sa is shaped into a strip. Note that the first inorganic-insulating-film-free region Sa shaped into a strip has a length $H_1$ as illustrated in FIG. 1 (hereinafter also referred to as a "width $H_1$ of the first inorganic-insulating-film-free region Sa"). The length $H_1$ is a length: between an end edge of the inorganic-insulating-film-free region Sa toward the notch N (an outward end edge) and an end edge of the inorganic-insulating-film-free region Sa toward the display region D (an inward end edge); and perpendicular to an extending direction of the first inorganic-insulating-film-free region Sa (a length in the direction X or in the direction Y). The length $H_1$ is, for example, approximately 1 to 100 µm.

In the first inorganic-insulating-film-free region Sa, first inorganic insulating film Ia is completely removed. That is, as illustrated in FIG. 6, the first inorganic-insulating-film-free region Sa is not provided with any of the base coat film 11, the gate insulating film 13, the first interlayer insulating film 15, or the second interlayer insulating film 17 included in the first inorganic insulating film Ia. In other words, the first inorganic insulating film Ia has an opening Aa formed to correspond to a position of the first inorganic-insulating-film-free region Sa. The opening Aa of the first inorganic insulating film Ia penetrates the first inorganic insulating film Ia in a thickness direction thereof (in the direction Z). That is, in the first inorganic-insulating-film-free region Sa, the resin substrate layer 10 is exposed.

As can be seen, in the organic EL display device 50a, the first inorganic-insulating-film-free region Sa, in which the first inorganic insulating film Ia is completely removed, is formed on an inorganic insulating film (the first inorganic insulating film Ia) around the notch N that is susceptible to cracks when the display panel is bent horizontally.

The above organic EL display device 50a displays an image as follows: In each sub-pixel P, a gate signal is input through the gate line 14 to the first TFT 9a. The first TFT 9a turns ON. Through the source line 18f, a data signal is written in the gate electrode 14b of the second TFT 9b and the capacitor 9c. A current in accordance with a gate voltage of the second TFT 9b is supplied from the power source line 18g to the organic EL layer 23. The supplied current allows the light-emitting layer 3 of the organic EL layer 23 to emit light and display the image. Note that, in the organic EL display device 50a, even if the first TFT 9a turns OFF, the gate voltage of the second TFT 9b is held in the capacitor 9c. Hence, the light-emitting layer 3 keeps emitting light until a gate signal of the next frame is input.

Described next is a method for producing the organic EL display device 50a of this embodiment. Here, the method for producing the organic EL display device 50a according to this embodiment includes: a resin substrate layer forming step; a TFT layer forming step; an inorganic-insulating-film-free-region forming step; an organic EL element layer forming step; a sealing layer forming step; and a notch forming step.

<Resin Substrate Layer Forming Step>

A not-shown support substrate such as, for example, a glass substrate is coated with non-photosensitive polyimide resin. The coated film is prebaked and postbaked to form the resin substrate layer 10 that is flexible.

TFT Layer Forming Step

Using a known technique, for example, the base coat film 11, the semiconductor layers 12a and 12b, the gate insulating film 13, the gate electrode 14a, the first interlayer insulating film 15, the second interlayer insulating film 17, and wiring layers (such as the source electrode 18a and the drain electrode 18b) are stacked in the stated order on the surface of the resin substrate layer 10 formed in the resin substrate layer forming step. Hence, the TFT layer 20 is formed. Specifically, the base coat film 11, the first TFTs 9a, the second TFTs 9b, the capacitors 9c, and the planarization film 19a are formed on the resin substrate layer 10 to form the TFT layer 20.

Inorganic-Insulating-Film-Free Region Forming Step

Of the first inorganic insulating film Ia formed on the resin substrate layer 10 at the TFT layer forming step, for example, a region including the notch N and the first inorganic-insulating-film-free region Sa illustrated in FIG. 1 (i.e. the base coat film 11, the gate insulating film 13, the first interlayer insulating film 15, and the second interlayer insulating film 17) is etched and removed. Hence, a rectangular inorganic-insulating-film-free region (hereinafter referred to as an "inorganic-insulating-film-free region S") is formed.

Organic EL Element Forming Step

Using a known technique, a plurality of the organic EL elements 25 are formed on the planarization film 19a of the TFT layer 20 formed at the TFT layer forming step. The organic EL elements 25 correspond to a plurality of the sub-pixels P included in the display region D. In order to form the organic EL element layer 30, the organic EL elements 25 include the first electrodes 21a, the edge cover 22a, the organic EL layers 23 (each including the hole-injection layer 1, the hole-transport layer 2, the light-emitting layer 3, the electron-transport layer 4, and the electron-injection layer 5), and the second electrode 24.

Sealing Film Forming Step

First, on the organic EL element layer 30 formed at the organic EL element layer forming step, an inorganic insulating film such as, for example, a silicon nitride film, a silicon oxide film, or a silicon nitride oxide film is deposited by plasma chemical vapor deposition (CVD) using a mask to form the first inorganic sealing film 36. Here, the mask is used for patterning so that the first inorganic sealing film 36 is not formed on the resin substrate layer 10 in the inorganic-insulating-film-free region S formed at the inorganic-insulating-film-free region forming step.

Next, on the surface of the substrate on which the first inorganic sealing film 36 is formed, an organic resin material such as acrylic resin is applied by, for example, ink-jet printing to form the organic sealing film 37.

After that, an inorganic insulating film such as, for example, a silicon nitride film, a silicon oxide film, or a silicon nitride oxide film is deposited to cover the organic sealing film 37 by the plasma CVD using a mask. Hence, the second inorganic sealing film 38 is formed. Here, the mask is used for patterning so that the second inorganic sealing film 38 is not formed on the resin substrate layer 10 in the inorganic-insulating-film-free region S formed at the inorganic-insulating-film-free region forming step. Through the above steps, the sealing layer 40 is formed.

Notch Forming Step

First, on the surface of the substrate on which the sealing layer 40 is formed at the sealing layer forming step, a not-shown protective sheet is attached. After that, a laser beam is emitted on the glass substrate of the resin substrate layer 10 to remove the glass substrate from the bottom face of the resin substrate layer 10. Then, to the bottom face, of the resin substrate layer 10, from which the glass substrate is removed, a not-shown protective sheet is attached.

Through the above steps, a plurality of display substrates (display panels) are produced. The display panels are arranged on a mother substrate in a matrix. The mother substrate is cut and divided with, for example, a laser beam into individual display panels.

Finally, an intermediate portion of a side of each individual display panel is cut out with, for example, a laser beam. Hence, the notch N is formed. More specifically, the resin substrate layer 10 in the inorganic-insulating-film-free region S formed at the inorganic-insulating-film-free region forming step is cut out with the laser beam along the peripheral end portion of the inorganic-insulating-film-free region S. Here, an area of the notch N is smaller than an area of the inorganic-insulating-film-free region S. Hence, the first inorganic-insulating-film-free region Sa shaped into a strip and the notch N are formed from the inorganic-insulating-film-free region S. Note that the notch N may be formed simultaneously when the mother substrate is divided into the individual display panels.

Through the above steps, the organic EL display device 50a of this embodiment can be produced.

As can be seen, the organic EL display device 50a of this embodiment can achieve the advantageous effects below.

(1) The organic EL display device 50a includes the first inorganic-insulating-film-free region Sa provided on the resin substrate layer 10 along the notch N. From the first inorganic-insulating-film-free region Sa, the first inorganic insulating film Ia is removed, and the first inorganic insulating film Ia is not found around the notch N. Such a feature makes it possible to reduce the risk of a crack opening in the first inorganic insulating film Ia near the notch N (around the notch N) when the display panel is bent horizontally, even if the display panel is designed to have the notch N provided relatively deeply toward the display region D.

(2) The crack is less likely to open in the first inorganic insulating film Ia around the notch N. As a result, the crack can be kept from propagating to another film.

Modification of First Embodiment

Figure 7:
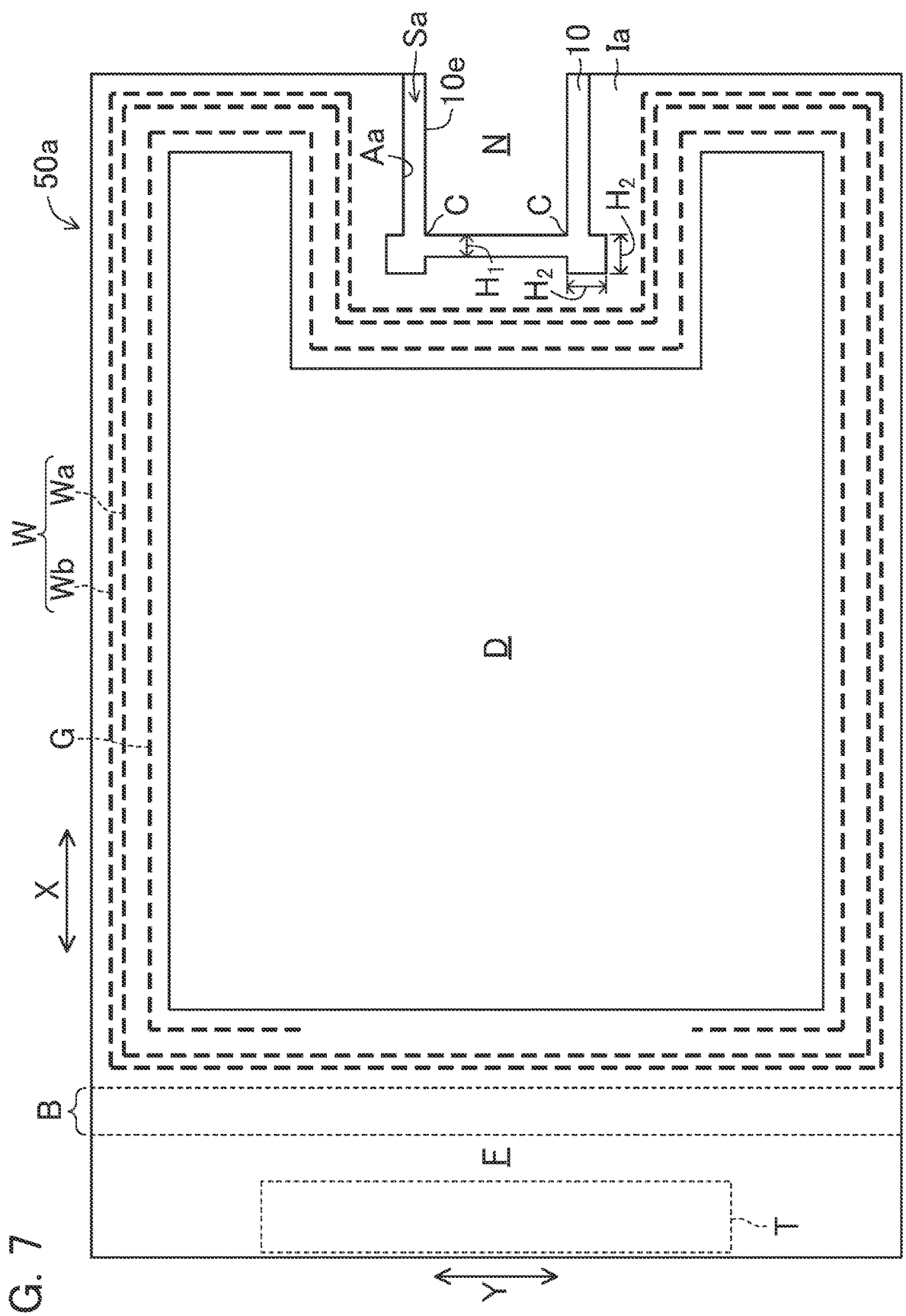
FIG. 7 is a plan view showing a modification of the organic EL display device according to the first embodiment of the disclosure.

FIG. 7 is a plan view showing a modification of the organic EL display device 50a. FIG. 7 corresponds to FIG. 1. In the organic EL display device 50a, a planar shape of the first inorganic-insulating-film-free region Sa (in particular, a planar shape of the first inorganic-insulating-film-free region Sa at a corner portion C of the notch N) may be changed as described below.

As illustrated in FIG. 7, in the modification of the organic EL display device 50a, a width $H_2$ of the inorganic-insulating-film-free region Sa at the corner portion C of the notch N is greater than the width $H_1$ of the first inorganic-insulating-film-free region Sa at a portion of the notch N other than the corner portion C (i.e. a side along the notch N). In other words, the first inorganic-insulating-film-free region Sa near the corner portion C of the notch N is enlarged in a diagonal direction of the notch N. Such a feature provides a further (larger) space between the corner portion C of the notch N and the first inorganic insulating film Ia near the corner portion C. The corner portion C is particularly susceptible to a crack opening in a diagonal direction of the notch N when the display panel is bent horizontally. As a result, the first inorganic insulating film Ia can be further kept from a crack opening around the corner portion C of the notch N.

Note that the width $H_2$ of the first inorganic-insulating-film-free region Sa at the corner portion C of the notch N is approximately twice as large as the width $H_1$ of the first inorganic-insulating-film-free region Sa at, for example, a portion of the notch N other than the corner portion C. That is, the width $H_2$ of the first inorganic-insulating-film-free region Sa is, for example, approximately 2 to 200 µm. Moreover, the shape of the first inorganic-insulating-film-free region Sa at the corner portion C of the notch N shall not be limited to a particular shape as long as a large space is provided, in a diagonal direction of the notch N, between an end edge of the first inorganic-insulating-film-free region Sa at the corner portion C and an end edge of the first inorganic-insulating-film-free region Sa toward the display region D. Other than the rectangular shape of the first inorganic-insulating-film-free region Sa illustrated in FIG. 7, the shape may be such a polygonal shape as a triangle, a pentagon, and a hexagon, a trapezoidal shape, and an oval shape.

In the above method for producing the organic EL display device 50a, the organic EL display device 50a of the modification can be produced as, for example, the shape of the pattern of the inorganic-insulating-film-free region S is changed in etching the first inorganic insulating film Ia at the inorganic-insulating-film-free region forming step.

Second Embodiment

Figure 8:
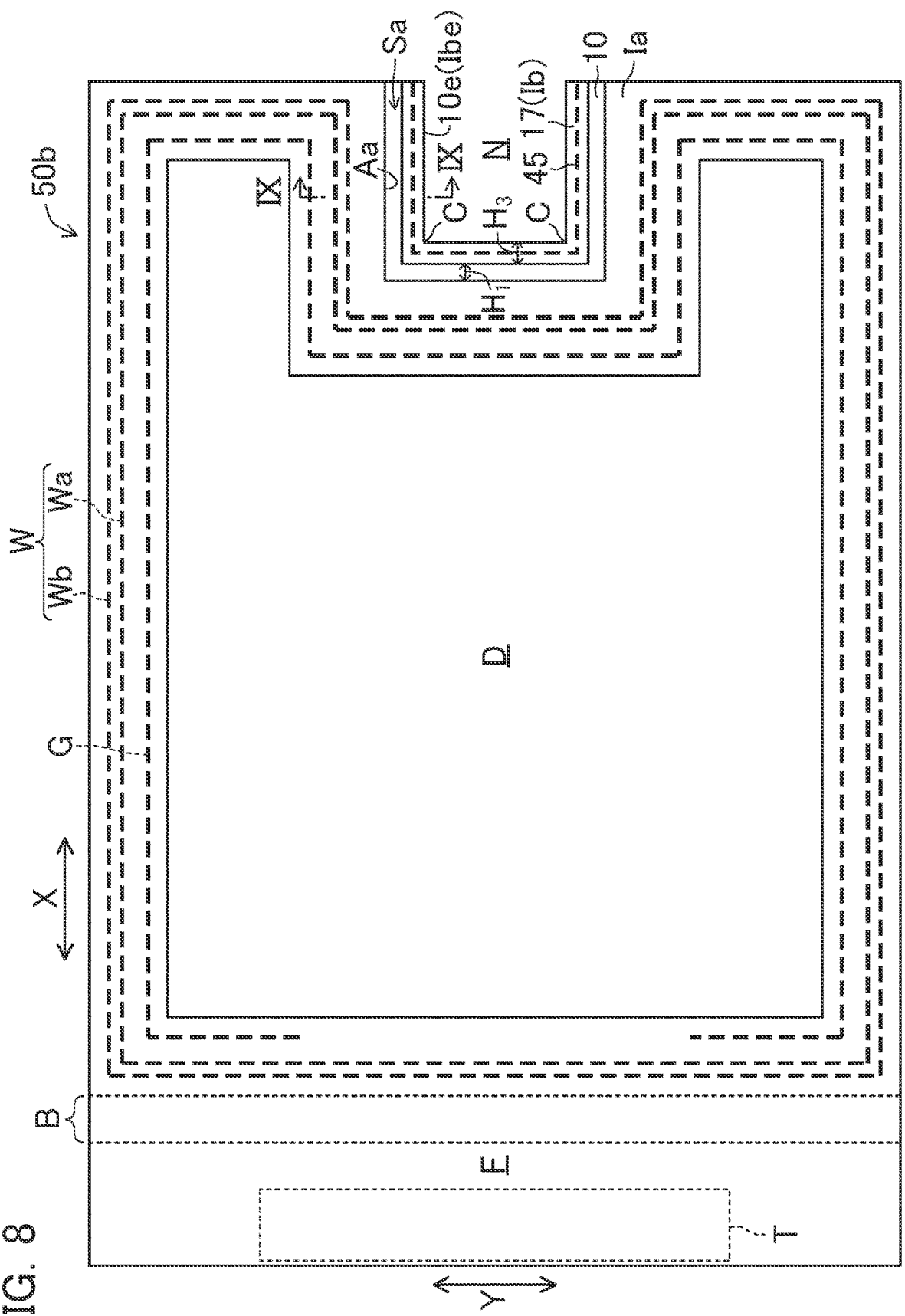
FIG. 8 is a plan view showing a schematic configuration of an organic EL display device according to a second embodiment of the disclosure.
Figure 9:
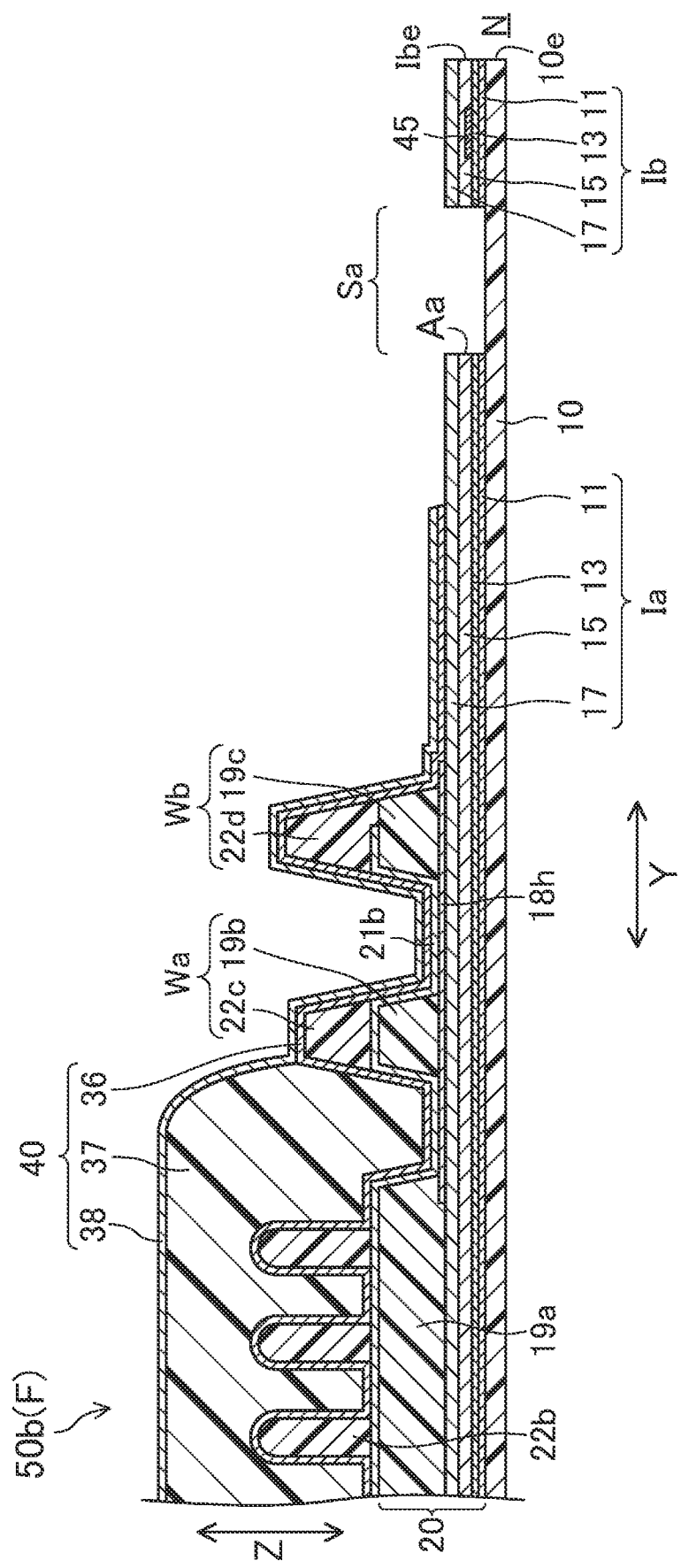
FIG. 9 is a cross-sectional view of the organic EL display device according to the second embodiment of the disclosure, taken from line IX-IX in FIG. 8.

Described next is a second embodiment of the disclosure. FIGS. 8 to 11 show the second embodiment of a display device according to the disclosure. FIG. 8 is a plan view showing a schematic configuration of an organic EL display device 50b according to this embodiment. FIG. 8 corresponds to FIG. 1. FIG. 9 is a cross-sectional view of the organic EL display device 50b, taken from line IX-IX in FIG. 8. FIG. 8 corresponds to FIG. 6. Note that the overall configuration of the organic EL display device 50b except the peripheral end portion of the notch N is the same as that described in the above first embodiment, and will not be elaborated upon here. Moreover, like reference signs designate identical or corresponding components between this embodiment and the first embodiment. Such components will not be elaborated upon here.

As illustrated in FIGS. 8 and 9, the organic EL display device 50b includes a second inorganic insulating film (hereinafter simply referred to as a "second inorganic insulating film Ib") provided in the directions X and Y between a peripheral end portion of the notch N and the first inorganic-insulating-film-free region Sa (an end portion of the first inorganic-insulating-film-free region Sa toward the notch N). The second inorganic insulating film Ib includes a plurality of layers. More specifically, as illustrated in FIGS. 8 and 9, provided on the resin substrate layer 10 are: the first inorganic-insulating-film-free region Sa shaped into a strip extending along the notch N; the first inorganic insulating film Ia toward the display region D with respect to the first inorganic-insulating-film-free region Sa; and the second inorganic insulating film Ib toward the notch N with respect to the first inorganic-insulating-film-free region Sa. In other words, the first inorganic insulating film Ia and the second inorganic insulating film Ib are spaced apart (divided) from each other across the first inorganic-insulating-film-free region Sa. In still other words, the first inorganic-insulating-film-free region Sa is formed in the directions X and Y between the first inorganic insulating film Ia and the second inorganic insulating film Ib.

As illustrated in FIG. 8, the second inorganic insulating film Ib is formed all around the notch N. Moreover, the second inorganic insulating film Ib is shaped into a strip extending along the notch N (the first inorganic-insulating-film-free region Sa). Note that the second inorganic insulating film Ib has a length $H_3$ as illustrated in FIG. 8 (i.e. a width $H_3$ of the second inorganic insulating film Ib). The length $H_3$ is a length: between an end edge of the second inorganic insulating film Ib toward the notch N and an end edge of the second inorganic insulating film Ib toward the display region D; and perpendicular to an extending direction of the second inorganic insulating film Ib (i.e. a length in the direction X or in the direction Y). The length $H_3$ may be either the same as, or different from, the width $H_1$ of the first inorganic-insulating-film-free region Sa. Preferably, the length $H_3$ is less than the width $H_1$. Here, similar to the first inorganic insulating film Ia, the second insulating film Ib includes: the base coat film 11; the gate insulating film 13; the first interlayer insulating film 15; and the second interlayer insulating film 17, all of which are provided above the resin substrate layer 10 in the stated order. In other words, the second inorganic insulating film Ib is formed of the same multilayer film as the multilayer film forming the first inorganic insulating film Ia.

Moreover, in the organic EL display device 50b illustrated in FIGS. 8 and 9, the second inorganic insulating film Ib has an end face (an end face toward the notch N) Ibe, and the resin substrate layer 10 has an end face (an end face toward the notch N and a divided face of an individual display panel) 10e. At the notch N, the end face Ibe is flush with the end face 10e.

Moreover, in the organic EL display device 50b illustrated in FIGS. 8 and 9, a wire 45 is provided between the gate insulating film 13 and the first interlayer insulating film 15, below the second inorganic insulating film Ib; that is, specifically, in a thickness direction (in the direction Z, or in cross-section) of the second inorganic insulating film Ib. More specifically, the wire 45 is formed on the gate insulating film 13 in the second inorganic insulating film Ib. To cover this wire 45, the first interlayer insulating film 15 and the second interlayer insulating film 17 are formed in the stated order. That is, the wire 45 disposed around the notch N is sandwiched between the gate insulating film 13 and the first interlayer insulating film 15 of the second inorganic insulating film Ib, and is not exposed. An example of the wire 45 includes a testing wire. Moreover, in this embodiment, the wire 45 may be a test element group (TEG), other than the testing wire.

As can be seen, the organic EL display device 50b includes the second inorganic insulating film Ib that prevents a testing wire such as the wire 45 and the TEG from being exposed when the testing wire and the TEG have to be arranged around the notch N.

In the method for producing the organic EL display device 50a according to the above first embodiment, the organic EL display device 50b can be produced as, for example, the wire 45 is formed at the TFT layer forming step and the shape of the pattern of the first inorganic-insulating-film-free region Sa is changed in etching the first inorganic insulating film Ia at the inorganic-insulating-film-free region forming step.

More specifically, at the TFT layer forming step, the base coat film 11 and the gate insulating film 13 are formed on the resin substrate layer 10. After that, the wire 45 is formed along the notch N, together with, for example, the source electrode 18a. After that, the first interlayer insulating film 15 and the second interlayer insulating film 17 are formed to cover the wire 45.

Then, at the inorganic-insulating-film-free region forming step, the first inorganic insulating film Ia behind the wire 45 (toward the display region D) is etched and divided along the notch N. Hence, the first inorganic-insulating-film-free region Sa is formed into a strip.

Finally, at the notch forming step, the resin substrate layer 10, the base coat film 11, the gate insulating film 13, the first interlayer insulating film 15 and the second interlayer insulating film 17, all of which are provided outside the wire 45 (toward the notch N), are cut with a laser beam to form the notch N, such that the second inorganic insulating film Ib including the wire 45 is formed (left) along the notch N. Hence, from toward the notch N to toward the display region D, the second inorganic insulating film Ib, the first inorganic-insulating-film-free region Sa, and the first inorganic insulating film Ia are formed in the stated order at the peripheral end portion of the notch N.

The organic EL display device 50b described above can achieve the advantageous effect below, in addition to the advantageous effect (2) above.

(3) In the organic EL display device 50b, the second inorganic insulating film Ib is provided in the directions X and Y between the peripheral end portion of the notch N and the first inorganic-insulating-film-free region Sa. The wire 45 is provided in the direction Z between the gate insulating film 13 and the first interlayer insulating film 15 of the second inorganic insulating film Ib. That is, the first inorganic-insulating-film-free region Sa is formed between the second inorganic insulating film Ib and the first inorganic insulating film Ia both provided to prevent the wire 45 from being exposed. Even if a crack opens in the second inorganic insulating film Ib when the display panel is bent horizontally, such a feature makes it possible to reduce the risk of the crack in the second inorganic insulating film Ib propagating to the first inorganic insulating film Ia.

First Modification of Second Embodiment

Figure 10:
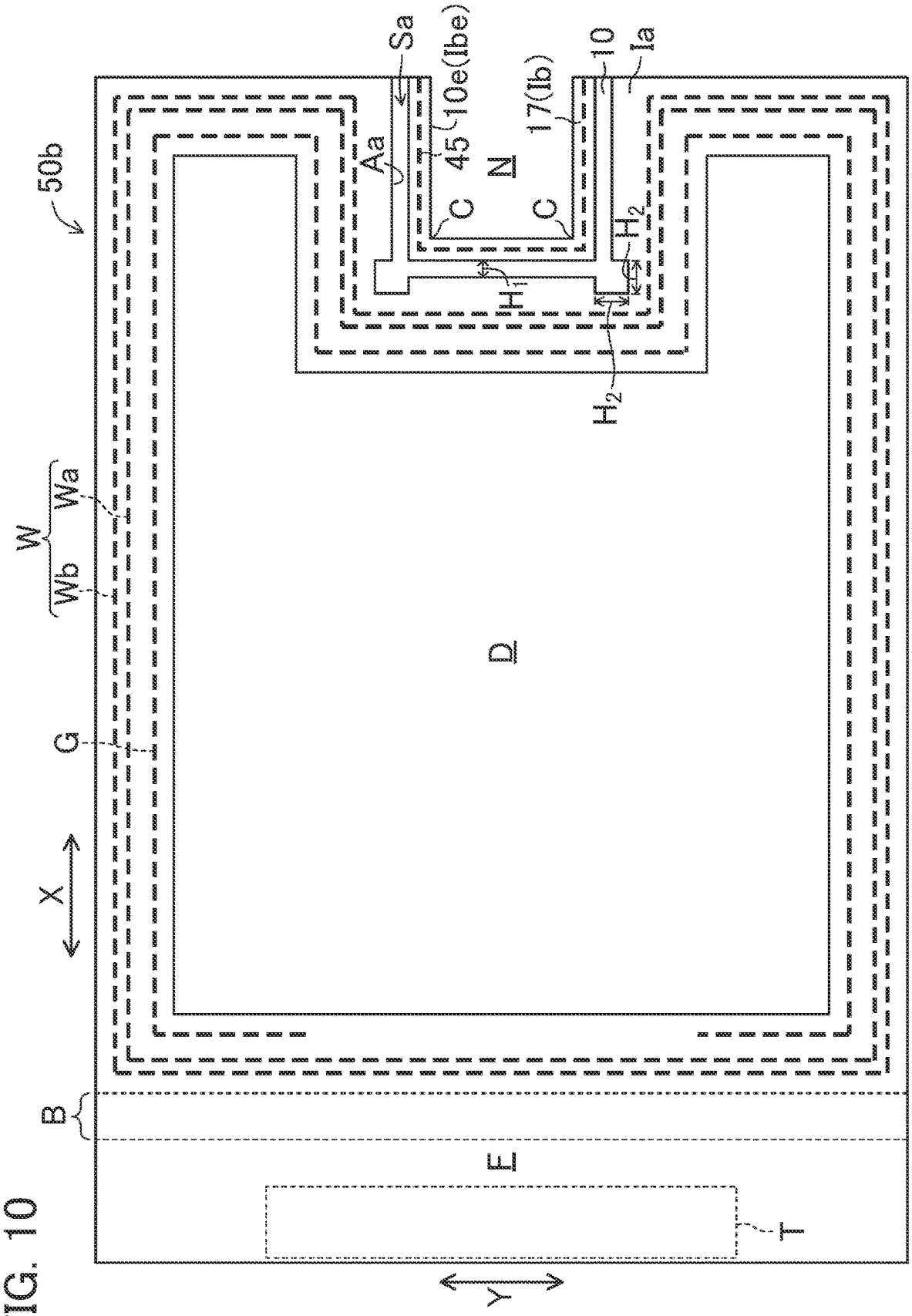
FIG. 10 is a plan view showing a first modification of the organic EL display device according to the second embodiment of the disclosure.

FIG. 10 is a plan view showing a first modification of the organic EL display device 50b. FIG. 10 corresponds to FIG. 1. As seen in the modification of the above organic EL display device 50a, in the organic EL display device 50b, a planar shape of the first inorganic-insulating-film-free region Sa may be changed.

As illustrated in FIG. 10, in the first modification of the organic EL display device 50b, the width $H_2$ of the first inorganic-insulating-film-free region Sa at the corner portion C of the notch N is greater than the width $H_1$ of the first inorganic-insulating-film-free region Sa at a portion of the notch N other than the corner portion C. Even if a crack opens in the second inorganic insulating film Ib at the corner portion C of the notch N, such a feature makes it possible to further reduce the risk of the crack propagating to the first inorganic insulating film Ia.

The organic EL display device 50b of the first modification can be produced as the shape of the pattern of the first inorganic-insulating-film-free region Sa is changed in etching the first inorganic insulating film Ia at, for example, the inorganic-insulating-film-free region forming step of the above method for producing the organic EL display device 50b.

Second Modification of Second Embodiment

Figure 11:
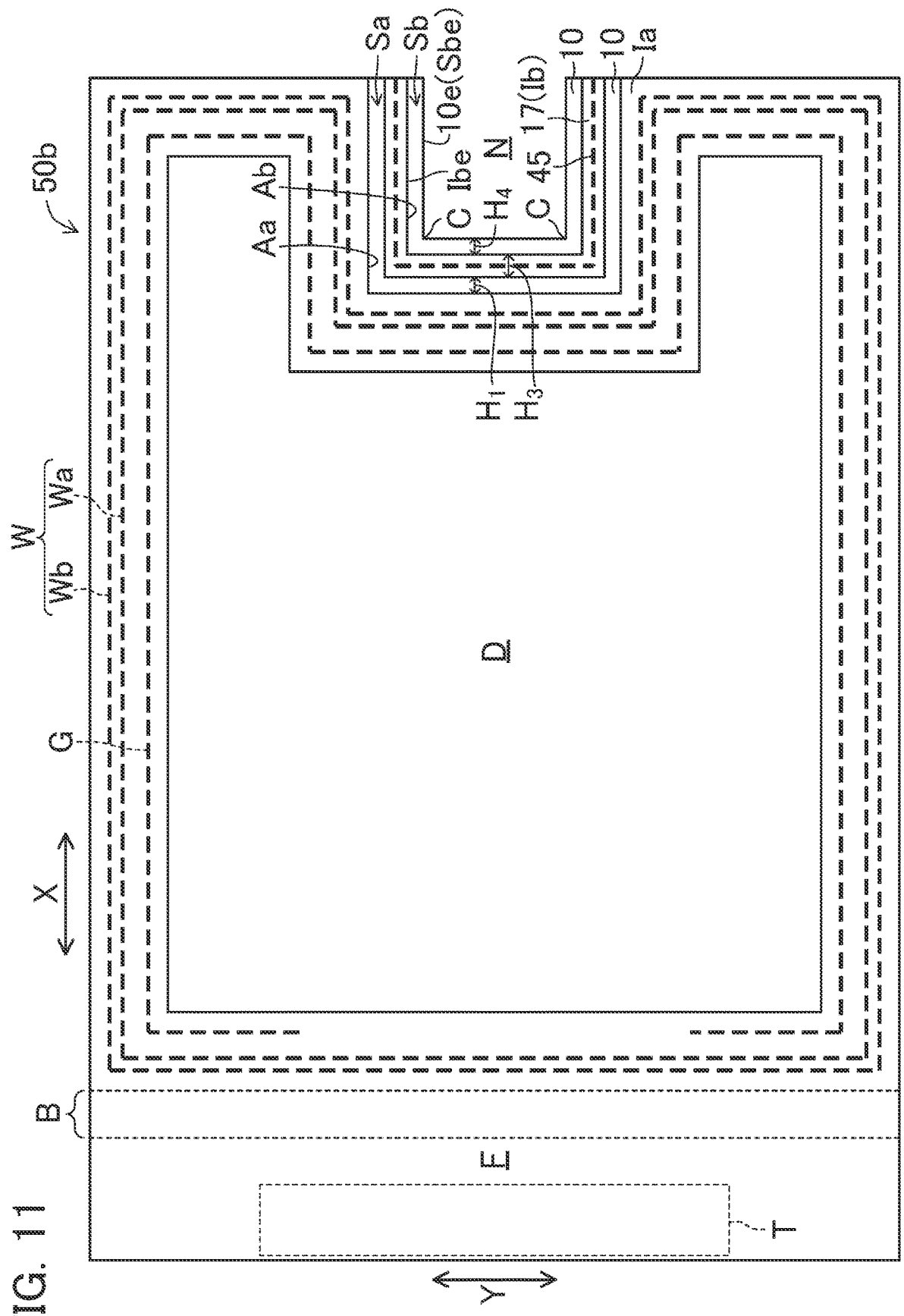
FIG. 11 is a plan view showing a second modification of the organic EL display device according to the second embodiment of the disclosure.

FIG. 11 is a plan view showing a second modification of the organic EL display device 50b. FIG. 11 corresponds to FIG. 1. The organic EL display device 50b may further include a second inorganic-insulating-film-free region Sb from which the second inorganic insulating film Ib is removed. The second inorganic-insulating-film-free region Sb is provided along the notch N.

As illustrated in FIG. 11, the organic EL display device 50b of the second modification is configured as follows: at the notch N, the end face Ibe of the second inorganic insulating film Ib is positioned behind (closer to the display region D) the end face 10e of the resin substrate layer 10. That is, the second inorganic-insulating-film-free region Sb is further formed closer to the notch N with respect to the second inorganic insulating film Ib. In other words, the second inorganic insulating film Ib is provided in the directions X and Y, between the second inorganic-insulating-film-free region Sb and the first inorganic-insulating-film-free region Sa.

As illustrated in FIG. 11, the second inorganic-insulating-film-free region Sb is formed all around the notch N. Moreover, the second inorganic-insulating-film-free region Sb is shaped into a strip and extending along the notch N (the first inorganic-insulating-film-free region Sa and the second inorganic insulating film Ib). Note that the second inorganic-insulating-film-free region Sb has a length $H_4$ as illustrated in FIG. 11 (i.e. a width $H_4$ of the second inorganic-insulating-film-free region Sb). The length $H_4$ is a length: between an end edge of the second inorganic-insulating-film-free region Sb toward the notch N and an end edge of the second inorganic-insulating-film-free region Sb toward the display region D; and perpendicular to an extending direction of the second inorganic-insulating-film-free region Sb (i.e. a length in the directions X and Y). The length $H_4$ may be either the same as, or different from, either the width $H_1$ of the first inorganic-insulating-film-free region Sa or the width $H_3$ of the second inorganic insulating film Ib.

The second inorganic-insulating-film-free region Sb is not provided with any of the base coat film 11, the gate insulating film 13, the first interlayer insulating film 15, or the second interlayer insulating film 17 included in the second inorganic insulating film Ib. In other words, the second inorganic insulating film Ib has an opening Ab formed to correspond to a position of the second inorganic-insulating-film-free region Sb. The opening Ab of the second inorganic insulating film Ib penetrates the second inorganic insulating film Ib in a thickness direction thereof (in the direction Z). That is, in the second inorganic-insulating-film-free region Sb, the resin substrate layer 10 is exposed.

As illustrated in FIG. 11, in the organic EL display device 50b of the second modification, the second inorganic-insulating-film-free region Sb has an end face Sbe. At the notch N, the end face Sbe is flush with the end face 10e of the resin substrate layer 10.

As can be seen, the organic EL display device 50b of the second modification further includes the second inorganic-insulating-film-free region Sb formed on the peripheral end portion of the notch N. When the display panel is bent horizontally, such a feature makes it possible to reduce the risk of a crack opening in the second inorganic insulating film Ib around the notch N. As a result, the feature makes it possible to further reduce the risk of the crack in the second inorganic insulating film Ib propagating to the first inorganic insulating film Ia.

The organic EL display device 50b of the second modification can be produced as the shape of the pattern of the first inorganic-insulating-film-free region Sa is changed in etching the first inorganic insulating film Ia at, for example, the inorganic-insulating-film-free region forming step of the above method for producing the organic EL display device 50b.

More specifically, at the inorganic-insulating-film-free region forming step, the first inorganic insulating film Ia behind the wire 45 (toward the display region D) is etched and divided along the notch N. Hence, the first inorganic-insulating-film-free region Sa is formed into a strip. After that, the first inorganic insulating film Ia outside the wire 45 (toward the notch N) is etched and removed. Hence, the inorganic-insulating-film-free region S is formed into a rectangular. Thus, the second inorganic insulating film Ib shaped into a strip is formed on the peripheral end portion of the inorganic-insulating-film-free region S (i.e. in the directions X and Y between the inorganic-insulating-film-free region S and the first inorganic-insulating-film-free region Sa).

Finally, at the notch forming step, the resin substrate layer 10 in the inorganic-insulating-film-free region S is cut out with the laser beam along the peripheral end portion of the inorganic-insulating-film-free region S, such that the area of the notch N is smaller than the area of the inorganicinsulating-film-free region S. Hence, the notch N is formed from the inorganic-insulating-film-free region S.

Third Embodiment

Figure 12:
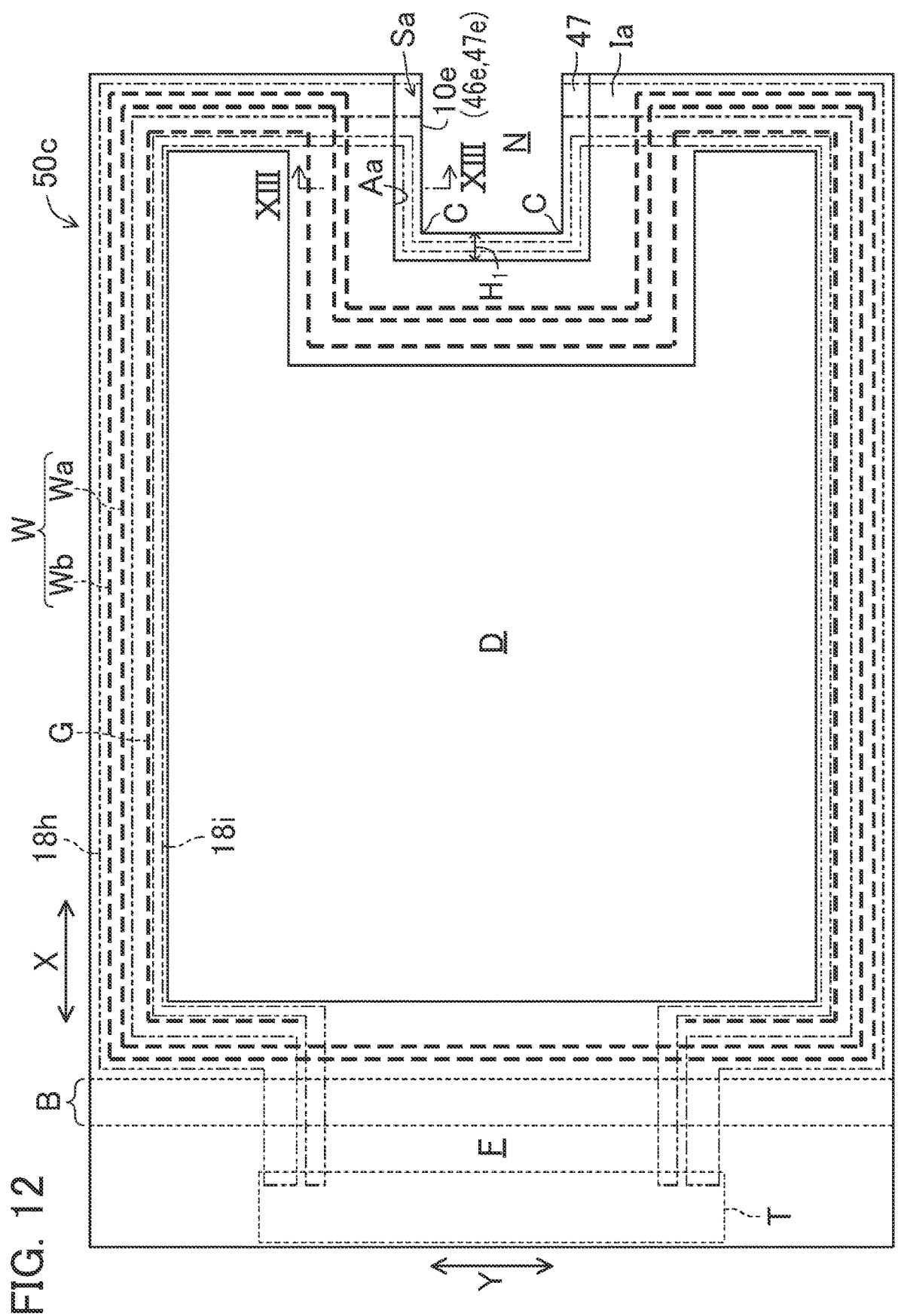
FIG. 12 is a plan view showing a schematic configuration of an organic EL display device according to a third embodiment of the disclosure.
Figure 13:
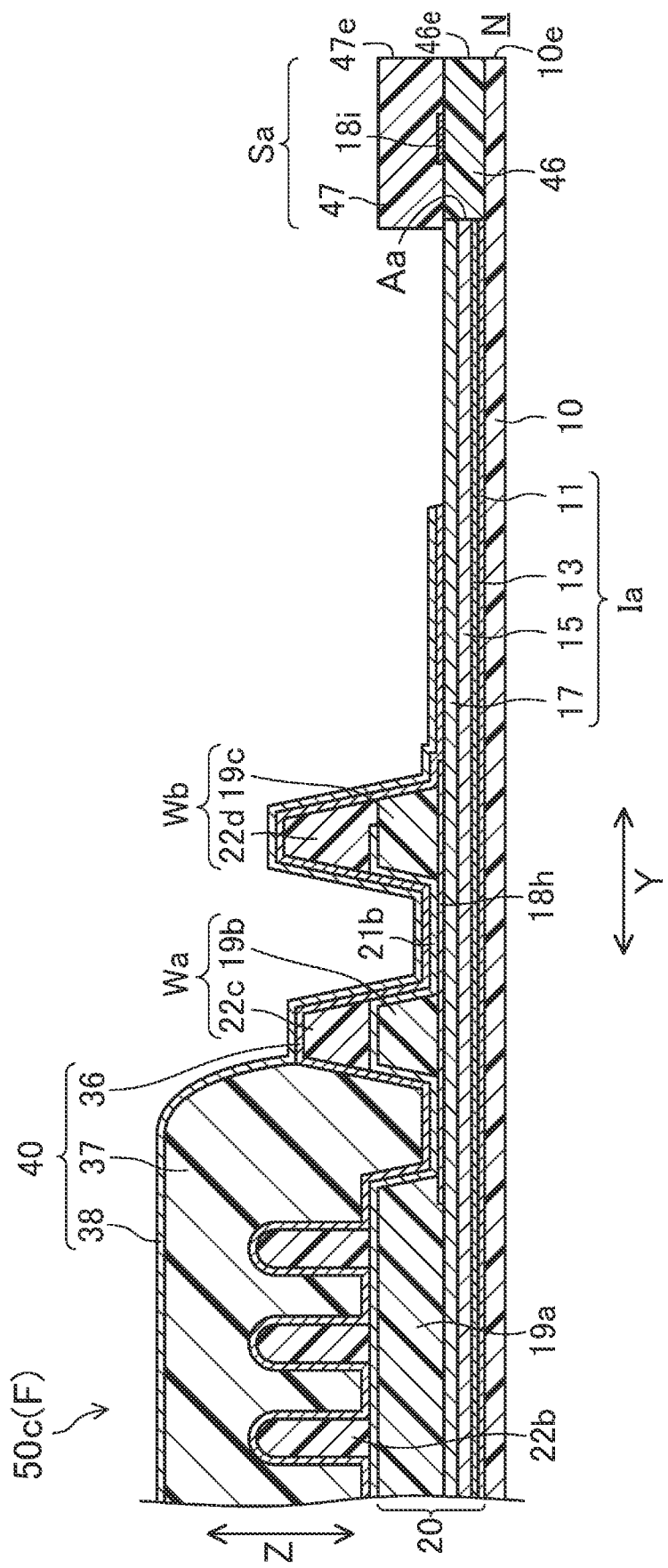
FIG. 13 is a cross-sectional view of the organic EL display device according to the third embodiment of the disclosure, taken from line XIII-XIII in FIG. 12.
Figure 14:
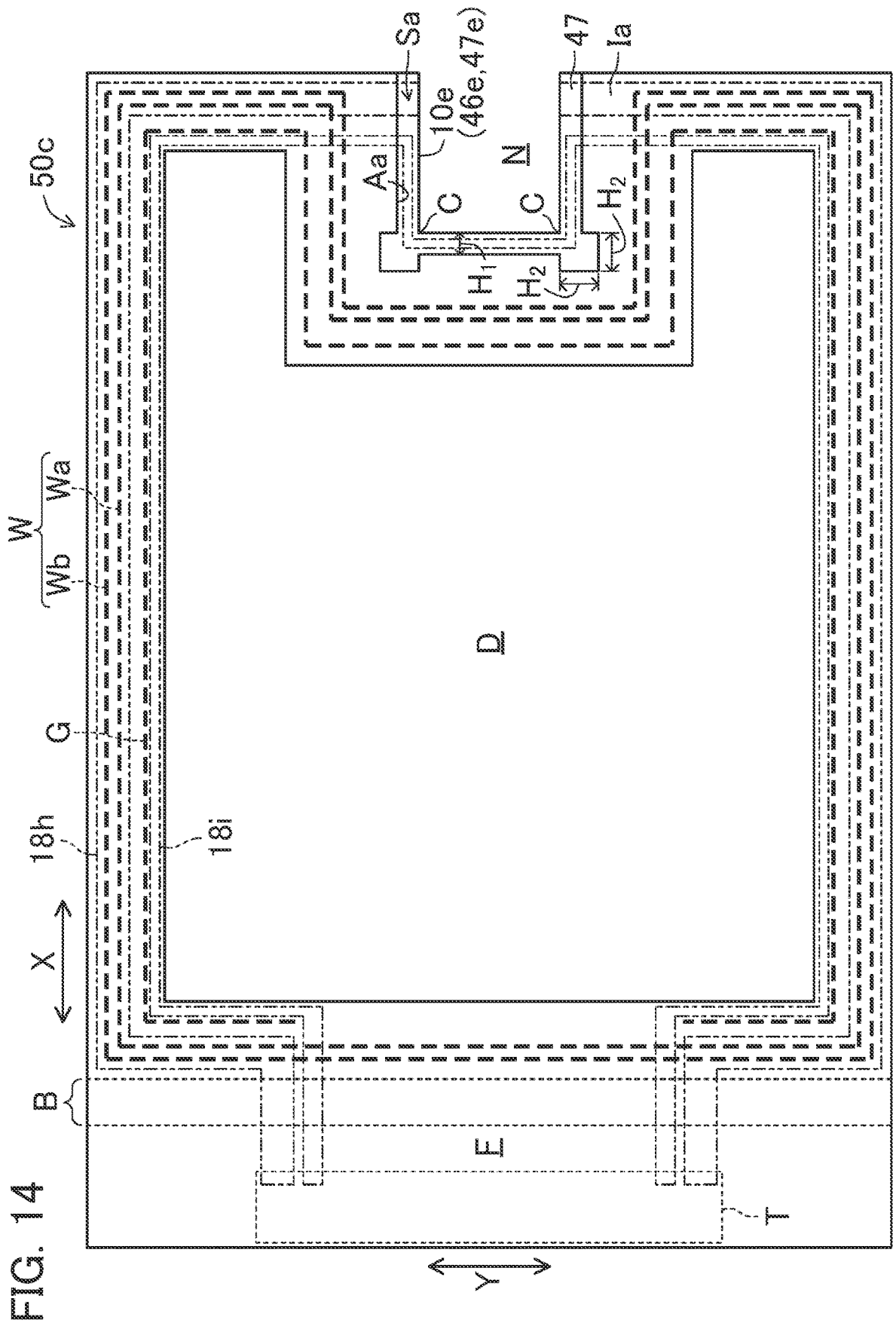
FIG. 14 is a plan view showing a modification of the organic EL display device according to the third embodiment of the disclosure.

Described next is a third embodiment of the disclosure. FIGS. 12 to 14 illustrate the third embodiment of a display device according to the disclosure. FIG. 12 is a plan view showing a schematic configuration of an organic EL display device 50c according to this embodiment. FIG. 12 corresponds to FIG. 1. FIG. 13 is a cross-sectional view of the organic EL display device 50c, taken from line XIII-XIII in FIG. 12. FIG. 13 corresponds to FIG. 6. Note that the overall configuration of the organic EL display device 50c except the peripheral end portion of the notch N is the same as that described in the above first embodiment, and will not be elaborated upon here. Moreover, like reference signs designate identical or corresponding components between this embodiment and the first embodiment. Such components will not be elaborated upon here.

As illustrated in FIGS. 12 and 13, the organic EL display device 50c includes: a filler film 46; the second frame wire 18i; and a planarization film 47, all of which are provided in the stated order above the resin substrate layer 10 in the first inorganic-insulating-film-free region Sa. The filler film 46, the second frame wire 18i, and the planarization film 47 are formed all around the notch N. Moreover, the filler film 46 and the planarization film 47 are formed into strips and extending along the notch N.

Moreover, in the organic EL display device 50c illustrated in FIGS. 12 and 13, the filler film 46 has an end face 46e, and the planarization film 47 has an end face 47e. At the notch N, the end face 46e and the end face 47e are flush with the end face 10e of the resin substrate layer 10.

As illustrated in FIG. 13, the filler film 46 is provided on the resin substrate layer 10 in the first inorganic-insulating-film-free region Sa, to fill the first inorganic-insulating-film-free region Sa. In other words, the filler film 46 is formed to fill the opening Aa of the first inorganic insulating film Ia in the first inorganic-insulating-film-free region Sa. That is, the filler film 46 is in contact with an upper face of the resin substrate layer 10 in the first inorganic-insulating-film-free region Sa, and with an end face of the first inorganic insulating film Ia toward the notch N. A thickness of the filler film 46 may be any given thickness, and may be either the same as, or different from, a thickness of the first inorganic insulating film Ia adjacent to the first inorganic-insulating-film-free region Sa. Exemplary materials of the filler film 46 include such positive organic resin materials as polyimide-based resin, acrylic resin, polysiloxane-based resin, and novolak resin.

As illustrated in FIG. 13, the second frame wire 18i is formed on the filler film 46. As described above, the second frame wire 18i is electrically connected to the power supply terminal receiving a high power-supply voltage (ELVDD) and to the power supply lines 18g.

As illustrated in FIG. 13, the planarization film 47 is formed on the filler film 46 and the first inorganic insulating film Ia adjacent to the filler film 46, to cover the second frame wire 18i. This planarization film 47, having a flat surface around the notch N, is formed of, for example, the same material as the material of the planarization film 47. The planarization film 47 may have any given thickness, and may be appropriately determined, depending on the shape of the peripheral end portion of the notch N.

As can be seen, the organic EL display device 50c includes the filler film 46 and the planarization film 47 that prevent a power supply wire such as the second frame wire 18i from being exposed when the power supply wire has to be disposed around the notch N.

Described next is a method for producing the organic EL display device 50c of this embodiment. In addition to the method for producing the organic EL display device 50a according to the first embodiment, the method for producing the organic EL display device 50c further includes, between the inorganic-insulating-film-free region forming step and the organic EL element layer forming step, a filler film forming step, a frame wire forming step, and a planarization film forming step.

Filler Film Forming Step

An organic resin material such as acrylic resin is applied by, for example, ink-jet printing to the surface of the resin substrate layer 10 in the first inorganic-insulating-film-free region Sa formed at the inorganic-insulating-film-free region forming step. The applied organic resin material is patterned to form the filler film 46.

Frame Wire Forming Step

On the filler film 46 formed at the filler film forming step, the same material as that of the source lines 18f is deposited and patterned by, for example, a known technique to form the second frame wire 18i.

Planarization Film Forming Step

An organic resin material such as acrylic resin is applied by, for example, ink-jet printing to the filler film 46 and the first inorganic insulating film Ia, in order to cover the second frame wire 18i formed at the frame wire forming step, the filler film 46 formed at the filler film forming step, and the boundary between the filler film 46 and the first inorganic insulating film Ia. The applied organic resin material is patterned to form the planarization film 47.

Through the above steps, the organic EL display device 50c of this embodiment can be produced.

The organic EL display device 50c described above can achieve the advantageous effect below, in addition to the advantageous effects (1) and (2) above.

(4) In the organic EL display device 50c, not the first inorganic insulating film Ia but the filler film 46, the second frame wire 18i, and the planarization film 47 are provided in the stated order above the resin substrate layer 10 in the first inorganic-insulating-film-free region Sa. The filler film 46 and the planarization film 47 are made of an organic resin material. Hence, compared with the first inorganic insulating film Ia, the filler film 46 and the planarization film 47 are resistant to a horizontal bend of the display panel and less likely to have cracks. Thus, the second frame wire 18i sandwiched between the filler film 46 and the planarization film 47 is less likely to be exposed. Such a feature can reduce the risk that the exposure of the second frame wire 18i would cause a short circuit with another wire.

Modification of Third Embodiment

FIG. 14 is a plan view showing a modification of the organic EL display device 50c. FIG. 14 corresponds to FIG. 1. As seen in the modification of the above organic EL display device 50a, in the organic EL display device 50c, a planar shape of the first inorganic-insulating-film-free region Sa may be changed.

As illustrated in FIG. 14, in the modification of the organic EL display device 50c, the width $H_2$ of the inorganic-insulating-film-free region Sa at the corner portion C of the notch N is greater than the width $H_1$ of the first inorganic-insulating-film-free region Sa at a portion of the notch N other than the corner portion C. Even if a crack opens in the filler film 46 and the planarization film 47 at the corner portion C of the notch N, such a feature makes it possible to further reduce the risk of the crack propagating to the first inorganic insulating film Ia.

The organic EL display device 50c of the modification can be produced as the shape of the pattern of the inorganic-insulating-film-free region S is changed in etching the first inorganic insulating film Ia at, for example, the inorganic-insulating-film-free region forming step of the above method for producing the organic EL display device 50c.

Other Embodiments

In the embodiments, the first inorganic insulating film Ia includes four layers stacked on top of another in the order of the base coat film 11, the gate insulating film 13, the first interlayer insulating film 15, and the second interlayer insulating film 17. Alternatively, the first inorganic insulating film Ia may include a single layer of the base coat film 11, or two layers of the base coat film 11 and the gate insulating film 13, or three layers of the base coat film 11, the gate insulating film 13, and the first interlayer insulating film 15.

In the second embodiment, the second inorganic insulating film Ib includes four layers stacked on top of another in the order of the base coat film 11, the gate insulating film 13, the first interlayer insulating film 15, and the second interlayer insulating film 17. Alternatively, the second inorganic insulating film Ib may include two layers of the base coat film 11 and the gate insulating film 13, or three layers of the base coat film 11, the gate insulating film 13, and the first interlayer insulating film 15.

In the first and third embodiments, the first inorganic-insulating-film-free region Sa is formed all around the notch N. Alternatively, the first inorganic-insulating-film-free region Sa may be formed only around the corner portion C, of the notch N, that is particularly susceptible to cracks.

In the above embodiments, each organic EL layer is formed of a multilayer including such five layers as the hole-injection layer, the hole-transport layer, the light-emitting layer, the electron-transport layer, and the electron-injection layer. Alternatively, the organic EL layer may be formed of a multilayer including such three layers as a hole-injection and hole-transport layer, the light-emitting layer, and an electron-transport and electron-injection layer.

Moreover, in the organic EL display devices of the above embodiments described as examples, the first electrodes are anodes and the second electrode is a cathode. Alternatively, the disclosure is applicable to an organic EL display device including an organic EL layer whose multilayered structure is inverted so that the first electrodes are cathodes and the second electrode is an anode.

Furthermore, in the organic EL display devices of the above embodiments described as examples, the electrodes of the TFTs connected to the first electrodes are drain electrodes. Alternatively, the disclosure is applicable to an organic EL display device in which the electrodes of the TFTs connected to the first electrodes are referred to as source electrodes.

In addition, the display devices of the embodiments described as examples are organic EL display devices. The disclosure is applicable not only to organic EL display devices but also to any flexible display devices. For example, the disclosure is applicable to a flexible display device including quantum-dot light emitting diodes (QLEDs); that is, light-emitting elements using layers containing quantum dots.

INDUSTRIAL APPLICABILITY

As can be seen, the disclosure is applicable to a flexible display device.

The invention claimed is:
1. A display device, comprising:
a flexible substrate, and a first inorganic insulating film including at least one layer and provided on the flexible substrate;
a notch provided at an end portion of the flexible substrate;
a first inorganic-insulating-film-free region from which the first inorganic insulating film is removed, the first inorganic-insulating-film-free region being provided along the notch;
a second inorganic insulating film including a plurality of layers and provided between a peripheral end portion of the notch and the first inorganic-insulating-film-free region; and
a wire provided between at least a pair of the plurality of layers included in the second inorganic insulating film.
2. The display device according to claim 1, wherein the first inorganic-insulating-film-free region is formed all around the notch.
3. The display device according to claim 1, wherein the first inorganic insulating film has an opening formed to correspond to a position of the first inorganic-insulating-film-free region.
4. The display device according to claim 1, wherein the first inorganic insulating film and the second inorganic insulating film are spaced apart from each other across the first inorganic-insulating-film-free region.
5. The display device according to claim 1, wherein the second inorganic insulating film is formed all around the notch.
6. The display device according to claim 1, wherein the first inorganic insulating film is formed of a multilayer film, and
the second inorganic insulating film is formed of a same multilayer film as the multilayer film forming the first inorganic insulating film.
7. The display device according to claim 1, wherein at the notch, an end face of the second inorganic insulating film is flush with an end face of the flexible substrate.
8. The display device according to claim 1, wherein at the notch, an end face of the second inorganic insulating film is positioned behind an end face of the flexible substrate.
9. The display device according to claim 8, further comprising:
a second inorganic-insulating-film-free region from which the second inorganic insulating film is removed, the second inorganic-insulating-film-free region being provided along the notch.
10. The display device according to claim 9, wherein the second inorganic-insulating-film-free region is formed all around the notch.
11. The display device according to claim 10, wherein at the notch, an end face of the second inorganic-insulating-film-free region is flush with the end face of the flexible substrate.

12. The display device according to claim 9, wherein
the second inorganic insulating film has an opening formed to correspond to a position of the second inorganic-insulating-film-free region.

13. The display device according to claim 9, wherein
the second inorganic insulating film is provided between the first inorganic-insulating-film-free region and the second inorganic-insulating-film-free region.

14. The display device according to claim 1, further comprising:
a filler film provided on the flexible substrate in the first inorganic-insulating-film-free region to fill the first inorganic-insulating-film-free region; and
a frame wire and a planarization film provided on the filler film, wherein
the frame wire is electrically connected to a power supply line, and
the planarization film covers the frame wire.

15. The display device according to claim 14, wherein
at the notch, an end face of the filler film and an end face of the planarization film are flush with an end face of the flexible substrate.

16. The display device according to claim 14, wherein
the filler film and the planarization film are formed of an organic resin material.

17. The display device according to claim 16, wherein
the filler film and the planarization film are formed of a same material.

18. The display device according to claim 1, wherein
in a direction perpendicular to an extending direction of the first inorganic-insulating-film-free region, a length between an end edge of the first inorganic-insulating-film-free region toward the notch and an end edge of the first inorganic-insulating-film-free region toward a display region is greater at a corner portion of the notch than at a portion of the notch other than the corner portion.

* * * * *